United States Patent
Setogawa

(10) Patent No.: US 6,775,190 B2
(45) Date of Patent: Aug. 10, 2004

(54) SEMICONDUCTOR MEMORY DEVICE WITH DETECTION CIRCUIT

(75) Inventor: Jun Setogawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 20 days.

(21) Appl. No.: 10/201,137

(22) Filed: Jul. 24, 2002

(65) Prior Publication Data

US 2003/0043646 A1 Mar. 6, 2003

(30) Foreign Application Priority Data

Aug. 28, 2001 (JP) ........................................ 2001-258208

(51) Int. Cl.[7] .............................................. G11C 7/00
(52) U.S. Cl. .................................. 365/193; 233/189.05
(58) Field of Search .............................. 365/233, 194, 365/193, 189.05; 375/355, 360

(56) References Cited

U.S. PATENT DOCUMENTS 6,556,505 B1 * 4/2003 Tojima et al. .............. 365/233
6,570,944 B2 * 5/2003 Best et al. ................... 375/355

FOREIGN PATENT DOCUMENTS

JP         8-110870         4/1996

* cited by examiner

Primary Examiner—David Lam
(74) Attorney, Agent, or Firm—McDermott Will & Emery LLP

(57) ABSTRACT

A detection circuit in a semiconductor memory device includes a first latch circuit and a second latch circuit. The first latch circuit latches a data strobe signal at a rise of a clock signal after a write latency passes. The second latch circuit receives an output signal of the first latch circuit at a rise of a clock signal to output a detection signal. Circuits in the semiconductor memory device are controlled by a detection signal. With such an operation applied, the semiconductor memory device grasps a correct phase difference between a data strobe signal and a clock signal, thereby enabling a normal operation.

12 Claims, 24 Drawing Sheets

SEMICONDUCTOR MEMORY DEVICE WITH DETECTION CIRCUIT

BACKGROUND OF THE INVENTION

1. Field of the Invention

The present invention relates to a semiconductor memory device, and more particularly, to a semiconductor memory device capturing data in response to a data strobe signal.

2. Description of the Background Art

A progress for a high information transmitting rate in information industry in recent years is also requested in the domain of a dynamic random access memory (hereinafter referred to as DRAM.

In such circumstances, in order to achieve supply and reception of data at a high rate, a double data rate synchronous dynamic random access memory (DDR SDRAM) has been adopted. DDR SDRAM can input/output data at a data rate twice that of a clock signal in synchronism with leading and trailing edges of a clock signal. In DDR SDRAM, an internal operation thereof is controlled with a clock signal. In a case where data is captured, the data is captured using a data strobe signal DQS inputted externally.

As a result, DDR SDRAM has a requirement to synchronize the data captured in synchronism with data strobe signal DQS, further, with a clock signal.

FIG. 25 is a block diagram showing a configuration of a data processing system using DDR SDRAM.

Referring to FIG. 25, the data processing system 1 includes a controller 2 and plural DIMMs 3 each constituted of DDR SDRAM.

Controller 2 controls all of processing system 1. Controller 2 outputs clock signal CLK for controlling each of DIMMs 3. Furthermore, controller 2 outputs data strobe signal DQS that is used when each DDIM 3 captures data.

While clock signal buses 4 are provided to respective DIMMs 3, a data strobe signal bus 5 is provided as a common bus with DIMMs 3.

As a result, a phase difference arises between clock signal CLK inputted to each DIMM and data strobe signal DQS. That is, while clock signal CLK inputted to each DIMM and clock signal have the same input timing as each other, a phase shift occurs on the side of data strobe signal DQS inputted to each DIMM. To DIMM3 closest to controller 2, data strobe signal DQS is inputted in timing earlier than clock signal CLK, while to DIMM3 farthest from controller 2, data strobe signal is inputted in timing later than clock signal CLK.

Further detailed description will be given of such a shift in phase.

FIG. 26 is a block diagram showing a configuration of a data input circuit in DDR SDRAM.

Referring to FIG. 26, a data input circuit 10 includes: a data strobe signal DQS synchronization circuit 12 and a clock signal CLK synchronization circuit.

Data strobe signal DQS synchronization circuit 12 includes latch circuits L1 to L5 transmission gates TM1 to TM4 and an inverter IV21.

Latch circuits L1 to L5 receive data strobe signal DQS at the clock terminals. Latch circuit L1 receives an internal data signal DQ at the input terminal when data strobe signal DQS is at L level. Furthermore, latch circuit L1 latches internal data signal DQ having received at the input terminal thereof to output a signal $\phi A0$ when data strobe signal DQS is at H level.

Latch circuit L2 receives signal $\phi A0$ when data strobe signal DQS is at H level. Furthermore, latch circuit L2 latches signal $\phi A0$ to output a signal $\phi A1$ when data strobe signal DQS is at L level.

Latch circuit L4 receives internal data signal DQ when data strobe signal DQS is at H level. Furthermore, latch circuit L4 latches internal data signal DQ having received at the input terminal thereof to output a signal $\phi B1$ when data strobe signal DQS is at L level.

Transmission gates TM1 to TM4 are each constituted of a P channel MOS transistor and an N channel MOS transistor.

Transmission gate TM1 is connected between latch circuit L2 and latch circuit L3. An output signal of inverter IV21 is inputted to the gate of the P channel MOS transistor in transmission gate TM1. Furthermore, an address signal ADD externally inputted is inputted to the gate of the N channel MOS transistor in transmission gate TM1.

Transmission gate TM2 is connected between latch circuit L2 and latch circuit L5. The output signal of inverter IV21 is inputted to the gate of the N channel MOS transistor in transmission gate TM2. Furthermore, address signal ADD is inputted to the gate of the P channel MOS transistor in transmission gate TM2.

Transmission gate TM3 is connected between latch circuit L4 and latch circuit L3. The output signal of inverter IV21 is inputted to the gate of the N channel MOS transistor in transmission gate TM3. Furthermore, address signal ADD is inputted to the gate of the P channel MOS transistor in transmission gate TM3.

Transmission gate TM4 is connected between latch circuit L4 and latch circuit L5. The output signal of inverter IV21 is inputted to the gate of the P channel MOS transistor in transmission gate TM4. Furthermore, address signal ADD is inputted to the gate of the N channel MOS transistor in transmission gate TM4.

Note that inverter IV21 receives address signal ADD to invert the signal and to output the inverted signal. When address signal ADD is at H level, transmission gates TM1 and TM4 are turned on while transmission gates TM2 and TM3 are turned off. Accordingly, signal $\phi A1$ outputted from latch circuit L2 is inputted to latch circuit L3. Furthermore, signal $\phi B1$ outputted from latch circuit L4 is inputted to latch circuit L5.

When address signal ADD is at L level, transmission gates TM2 and TM3 are turned on while transmission gates TM1 and TM4 are turned off. Accordingly, signal $\phi A1$ outputted from latch circuit L2 is inputted to latch circuit L5. Furthermore, signal $\phi B1$ outputted from latch circuit L4 is inputted to latch circuit L3.

As a result, address signal ADD changes a transmission path of internal data signal DQ.

Latch circuit L3 receives a signal at the input terminal when data strobe signal DQS is at L level. Furthermore, latch circuit L3 latches the signal having received at the input terminal to output a signal $\phi A2$ when data strobe signal DQS is at H level.

Latch circuit L5 receives a signal at the input terminal when data strobe signal DQS is at L level and latches the signal having received at the input terminal to output a signal $\phi B2$ when data strobe signal DQS is at H level.

Clock signal synchronization circuit 13 includes latch circuits L6, L7, L22 and L23. Latch circuit L6 receives signal $\phi A2$ when clock signal CLK is at L level and latches signal $\phi A2$ and output the signal to latch circuit L22 when clock signal CLK is at H level. Latch circuit L22 receives an output signal of latch circuit L6 when clock signal CLK is at H level and latches an output signal of latch circuit L6 to output the signal as a signal φA4 to a circuit in DDR SDRAM when clock signal CLK is at L level.

Latch circuits L7 and L23 operate in a similar way to the cases of latch circuits L6 and L22. Latch circuit L7 receives signal φB2 at the input terminal thereof and latch circuit L23 outputs signal φB4 to a circuit in DDR SDRAM.

FIG. 27 is a timing chart showing operation of data input circuit 10 of FIG. 26.

Referring to FIG. 27, in DDR SDRAM, data DQ is in synchronism with rising edge and falling edges of data strobe signal DQS. A data signal DQ1 is in synchronism with the rising edge of data strobe signal DQS. Data signal DQ1 includes a set-up time tDS and a hold time DH relative to data strobe signal DQS. A data signal DQ2 is in synchronism with the falling edge of data strobe signal DQS. Data signal DQ2 includes a set-up time tDS and a hold time DH relative to data strobe signal DQS similar to data DQ1.

Now, on the assumption that address signal ADD is at H level, description will be given of operation in data input circuit 10.

First of all, description will be given of operation in latch circuit L1 in data input circuit 10.

Just before time t1, data strobe signal DQS is at L level. Therefore, latch circuit L1 receives data DQ1. At time t1, since data strobe signal DQS rises to H level, signal φA0 outputted from latch circuit L1 becomes data signal DQ1. Even at time t2 since data strobe signal DQ stays at H level, signal φA0 keeps on being data signal DQ1 as it is. At time t3, data strobe signal DQS falls to L level. Hence, at this time, latch circuit L1 receives data signal DQ2. Therefore, signal φA0 keeps on being data DQ2 during hold time DH of data DQ2 from time t3.

Then, description will be given of operation in latch circuit L2.

At time t1, data strobe signal DQS rises to H level. Hence, circuit L2 receives signal φA0. At time t3, data strobe signal DQS falls, but signal φA0 keeps on being data DQ1 till time t3, so signal φA1 outputted from latch circuit L2 is latched at data DQ1. Therefore, signal φA1 is kept on being fixed at DQ1 till time t4.

Latch circuit L3 receives signal φA1 when data strobe signal DQL is at L level and latches signal φA1 to output signal φA2 when data strobe signal DQS is at L level. Hence, signal φA2 outputted from latch circuit L3 keeps on being data signal DQ1 in a period from time t3 to t5.

Since latch circuit L4 receives an input signal from the input terminal thereof when data strobe signal DQS is at H level, latch circuit L4 receives data DQ1 at time t1. When at time t2, data signal changes from DQ1 to DQ2, and then latch circuit L4 receives data signal DQ2 instead. As a result, signal φB1 outputted from latch circuit 14 is data signal DQ1 in a period from time t1 to t2 and data signal DQ2 in a period from time t2 to t4.

Latch circuit L5 receives a signal when data strobe signal DQS is at L level. As a result, signal φB2 outputted from latch circuit L5 is data DQ2 in a period from time t3 to t5.

As a result of the above operation, data DQ1 and DQ2 inputted as a serial signal externally is separated in data strobe signal DQS synchronization circuit 12 and a data length becomes to be of one cycle.

Then, description will be given of operation in clock signal CLK synchronization circuit 13.

Latch circuit L6 latches signal φA2 when clock signal at L level. Hence, signal φA3 outputted from latch circuit L6 keeps on being data DQ1 in a period from time t3 to t5. Likewise, signal φB3 outputted from latch circuit L7 keeps on being data DQ2 in a period from time t3 to t5.

With the above operation applied, data DQ1 and DQ2 inputted in synchronism with data strobe signal DQS is synchronized with clock signal CLK. Data DQ1 and DQ2 having synchronized with clock signal CLK is outputted to circuits in DDR SDRAM.

The maximum operating frequency of a prior art DDR SDRAM was of the order of 100 MHz. In addition, a variation in phase of data strobe signal DQS relative to clock signal CLK was restricted within ±0.25 cycle.

FIG. 28 is a timing chart showing operation of data input circuit 10 in a case where a phase difference between clock signal CLK and data strobe signal DQS is produced.

Referring to FIG. 28, a data strobe signal DQS1 is data strobe signal DQS in a case where it suffers a phase difference of −0.25 cycle relative to clock signal CLK (hereinafter referred to as −0.25 tCLK). Hereinafter, this state is described such that data strobe signal DQS earlier than clock signal CLK.

A signal φA2-1 is a signal outputted from latch circuit L3 in a case of data strobe signal DQS1.

A data strobe signal DQS2 is data strobe signal DQS in a case where it suffers no phase difference relative to clock signal CLK. A signal φA2-2 is a signal outputted from latch circuit L3 in a case of data strobe signal DQS2. A data strobe signal DQS3 is data strobe signal DQS in a case where it produces a phase difference of +0.25 tCLK relative to clock signal CLK. Hereinafter, this state is described such that data strobe signal DQS later than clock signal CLK.

A signal φA2-3 is a signal outputted from latch circuit L3 in a case of a data strobe signal DQS3.

In the case of FIG. 28, data strobe signal DQS is restricted within ±0.25 tCLK. Therefore, a data length (1 tCLK) of each of signals φA2 to φA3 is longer than total time of variation 0.5 tCLK and set-up time tDS and hold time tDH.

Hence, clock signal CLK synchronization circuit 13 can capture normal data at all times.

However, in a case where an operation speed of DDR SDRAM is further faster, that is an operating frequency thereof is further higher, according to a request for increase in operation speed in recent years, data transfer is disabled from data strobe signal DQS synchronization circuit to clock signal CLK synchronization circuit.

FIG. 29 is a timing chart showing operation in data input circuit 10 in a case where a phase difference is produced between clock signal CLK and data strobe signal DQS at an operating frequency twice that in FIG. 28.

Referring to FIG. 29, data strobe signals DQS1 to DQS3 and signals φA2-1 to φA2-3 are the same as in FIG. 28; therefore, no description thereof is repeated.

A variation of data strobe signal DQS relative to clock signal CLK is not dependent on an operating frequency. Therefore, a variation is ±0.25 tCLK at an operating frequency of 100 MHz, while a variation is ±0.5 tCLK at an operating frequency of 200 MHz.

Accordingly, a data length (1 tCLK) of each of signals φA2-1 to φA2-3 is much shorter than total time of variation 1.0 tCLK and set-up time tDS and hold time tDH.

As a result, clock signal CLK synchronization circuit 13 cannot capture normal data.

In such a way, when an operating frequency increases, a possibility of causing DDR SDRAM to malfunction is higher unless it is grasped what level a phase difference is produced between data strobe signal DQS and clock signal CLK at and a proper measure is taken against the phase difference.

SUMMARY OF THE INVENTION

It is an object of the present invention to provide a semiconductor memory device capable of correctly grasping a phase difference between data strobe signal DQS and clock signal CLK to perform normal operation even at a high operation speed.

A semiconductor memory device according to the present invention includes: a detection circuit detecting a phase difference between a clock signal inputted externally and a strobe signal, which is inputted externally, and which is a signal for capturing data, to output a result of the detection as a detection signal; and a data input circuit inputting the data in response to the detection signal.

Thereby, detection can be achieved of a phase difference between a data strobe signal and a clock signal, thereby enabling control on the data input circuit according to a detection result.

According to the present invention, a phase difference between a data strobe signal and a clock signal can be detected. Furthermore, by controlling circuits in a semiconductor memory device using a result of the detection, correct data can be externally captured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention with reference to the accompanying drawings. Note that the same symbols are attached to the same constituents or corresponding constituents and no description thereof is repeated.

First Embodiment

Figure 1:
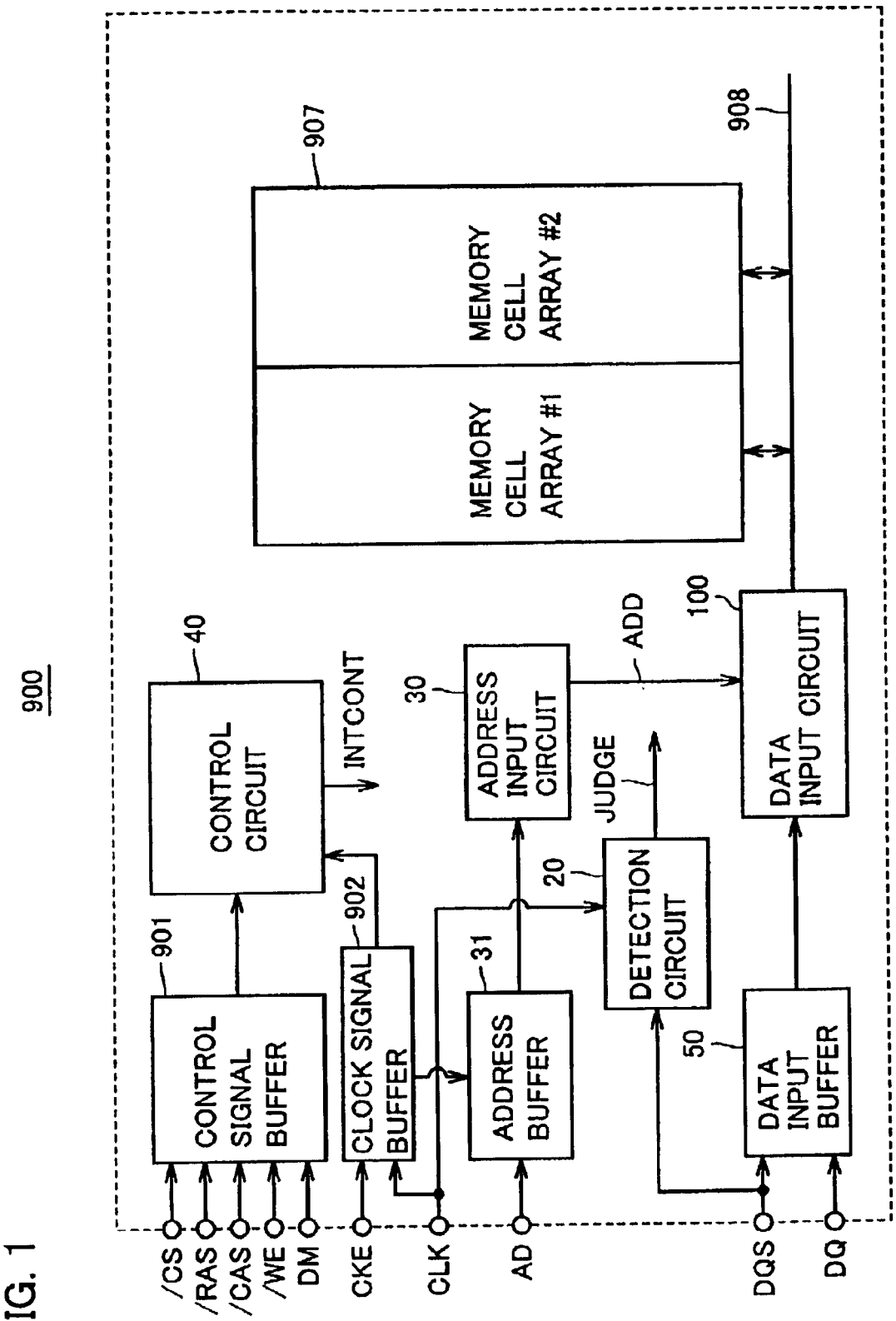
FIG. 1 is a block diagram showing a configuration of a semiconductor memory device in a first embodiment of the present invention.

FIG. 1 is a block diagram showing a configuration of a semiconductor memory device in a first embodiment of the present invention.

Referring to FIG. 1, a semiconductor memory device 900 includes: a control signal buffer 901; a clock signal buffer 902; an address input buffer 31; an address input circuit 30; a data input buffer 50; a data input circuit 100; a control circuit 40; and memory cell arrays 907.

Control signal input buffer 901 receives a chip select signal /CS, a row address strobe signal /RAS, a column address strobe signal /CAS, a write enable signal /WE and a data mask signal DM from the outside and outputs the signals as internal signals.

Clock signal buffer 902 receives a clock enable signal CLK and clock signal CLK, and outputs an internal clock signal int.CLK.

Control circuit 40 receives an internal control signal and internal clock signal int.CLK, and outputs a control signal. The control signal is a signal for use in controlling all of the semiconductor memory device 900.

Address input buffer 31 receives an address signal AD externally to output the signal as an internal address signal. Address input circuit 30 synchronizes the internal address signal with data strobe signal DQS to output the internal address signal as an address signal ADD to data input circuit 100.

Data buffer 50 outputs data signal DQ inputted from an external input terminal and data strobe signal DQS as an internal data signal. Data input circuit 100 synchronizes data signal DQ having synchronized with data strobe signal DQS, further, with clock signal CLK. Furthermore, data input circuit 100 selects a path along which data signal DQ is transmitted according to address signal ADD received from address input circuit 30. Note that data signal DQ is transmitted to memory cell arrays 907 through a data input/output line 908.

Memory cell array 907 has plural memory cells arranged in matrix. Data signal DQ inputted from the outside is stored on a memory cell.

Detection circuit 20 detects a phase difference between data strobe signal DQS and clock signal CLK.

Figure 2:
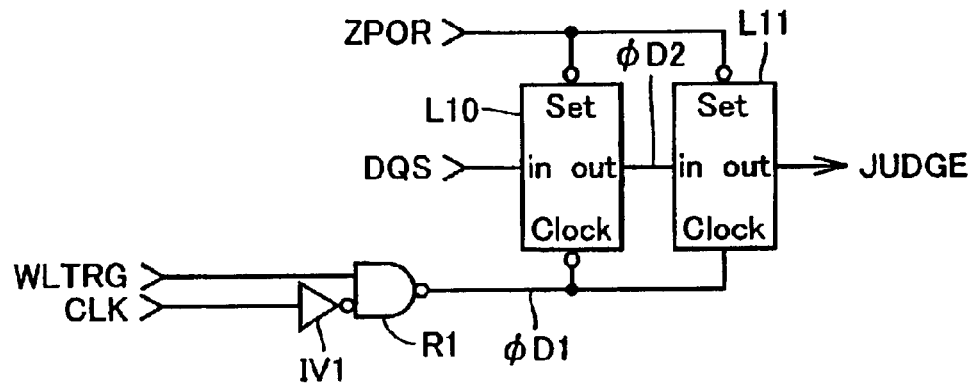
FIG. 2 is a circuit diagram showing a configuration of a detection circuit of FIG. 1.

FIG. 2 is a circuit diagram showing a configuration of detection circuit 20 of FIG. 1.

Referring to FIG. 2, detection circuit 20 includes latch circuits L10 and L11 an inverter IV1 and a logic gate R1.

Logic gate R1 receives a signal WLTRG and an output signal of inverter IV1 to output a result of a NAND logical operation as a signal φDI. Inverter IV1 receives clock signal CLK to invert the signal and to output the inverted signal.

Signal WLTRG is a signal outputted from control circuit 40 when a prescribed write latency passes after determination of a write command.

Figure 3:
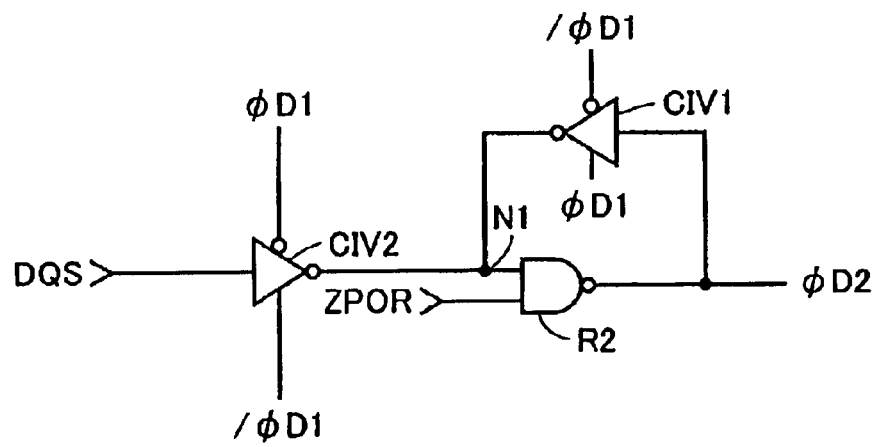
FIG. 3 is a circuit diagram showing an example configuration of a latch circuit of FIG. 2.

FIG. 3 is a circuit diagram showing a configuration of latch circuit 10 of FIG. 2.

Figure 4:
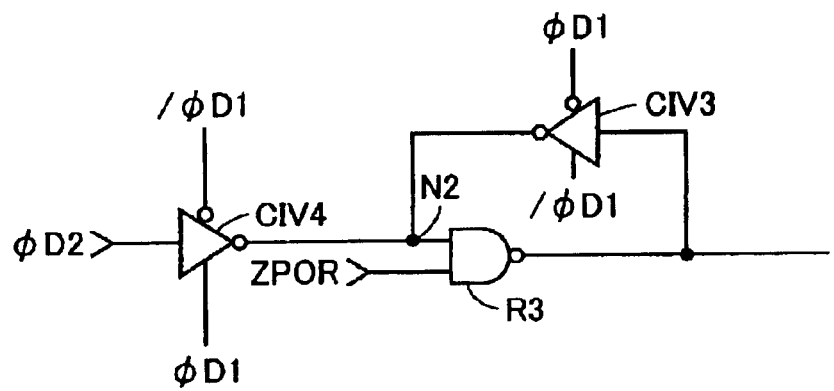
FIG. 4 is a circuit diagram showing another example configuration of the latch circuit of FIG. 2.

FIG. 4 is a circuit diagram showing a configuration of latch circuit L11 of FIG. 2.

Referring to FIG. 3, latch circuit L10 includes clocked inverters CIV1 and CIV2 and a logic gate R2.

Clocked inverter CIV1 operates when signal φD1 is at H level. Clocked inverter CIV2 operates when signal φD1 is at L level.

Clocked inverter CIV2 receives data strobe signal DQS to invert the signal and to output the inverted signal. One input terminal of logic gate R2 is connected to the output terminal of clocked inverter CIV2 at a node N1 and a power-on reset signal ZPOR is inputted to the other input terminal thereof.

Logic gate R2 outputs a result of a NAND logical operation on signals inputted at the two input terminals of logic gate R2 as signal φD2.

The input terminal of clocked inverter CIV1 is connected to the output terminal of logic gate R2 and the output terminal thereof is connected to an input terminal of logic gate R2 at node N1.

Referring to FIG. 4, latch circuit L11 includes clocked inverters CIV3 and CIV4 and a logic gate R3.

Clocked inverter CIV3 operates when signal φD1 is at L level. Clocked inverter CIV4 operates when signal φD1 is at H level.

Clocked inverter CIV4 receives signal φD2 to invert the signal and to output the inverted signal. One input terminal of logic gate R3 is connected to the output terminal of clocked inverter CIV4 at a node N2 and power-on reset signal ZPOR is inputted to the other input thereof.

Logic gate R3 outputs a result of a NAND logical operation on signals inputted to the two input terminals thereof as a detection signal JUDGE.

The input terminal of clocked inverter CIV3 is connected to the output terminal of logic gate R3 and the output terminal of clocked inverter CIV3 is connected to an input terminal of logical gate R3 at node N2.

Description will be given of operation in detection circuit 20 having the above circuit configuration.

Figure 5:
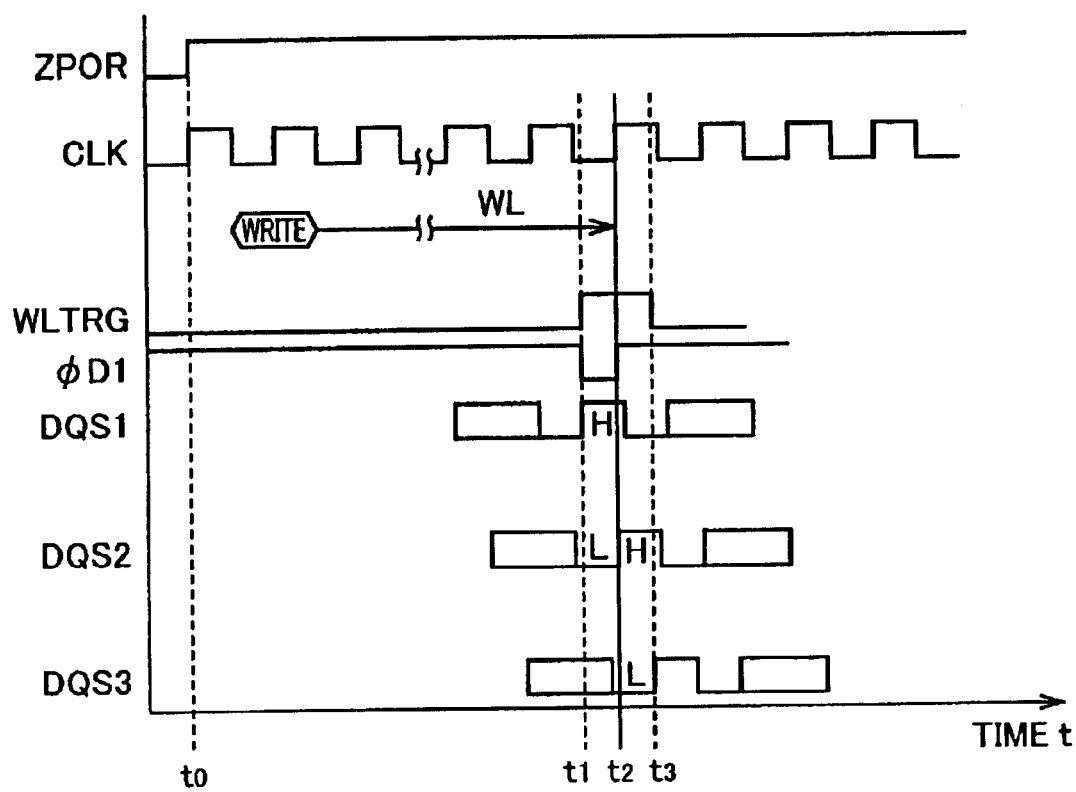
FIG. 5 is a timing chart showing operation in a detection circuit.

FIG. 5 is a timing chart showing operation in detection circuit 20.

Figure 6:
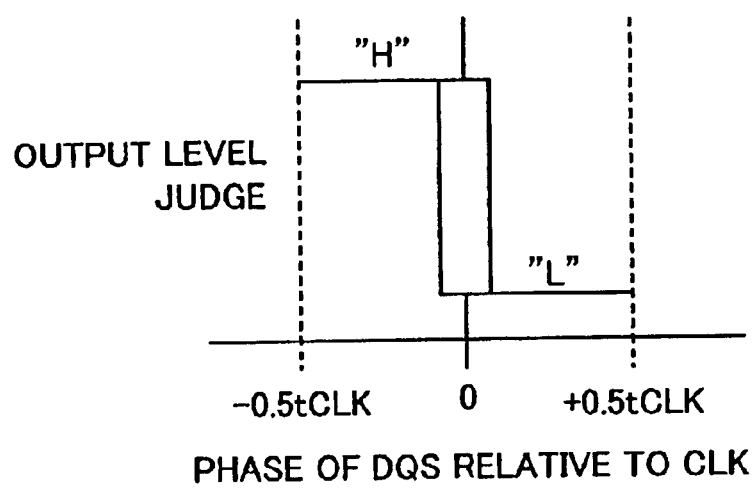
FIG. 6 is a graph showing a detection result outputted from a detection circuit according to the timing chart of FIG. 5.

FIG. 6 is a graph showing a detection result outputted from detection circuit 20 according to the timing chart of FIG. 5.

Referring to FIG. 5, before time t0, power-on reset signal ZPOR is at L level. Consequently, latch circuits L10 and L11 are in a reset state. Therefore, signal φD2, which is an output signal of latch circuit L10, and detection signal JUDGE, which is an output signal of latch circuit L11, are both at H level.

At time t0, power-on reset signal ZPOR is at H level. In order to put the semiconductor memory device into a write mode after time t0, if write signal WRITE is outputted from control circuit 40, when a write latency passes after write signal WRITE is outputted is time t2. Therefore, control circuit 40 outputs signal WLTRG such that detection circuit 20 performs a detection operation at time t2. Accordingly, signal WTRG is activated at time t1 earlier than time t2 and deactivated at time t3. That is, signal WLTRG is outputted as a pulse signal. As a result, signal D1, which is an output signal of logic gate R1, assumes L level at time t1 and H level at time t2.

In latch circuit L10 in detection circuit 20, clocked inverter CIV2 starts an operation at time t1. At this time, clocked inverter CIV1 does not operate. Therefore, data strobe signal DQS inputted to latch circuit L10 is outputted as it is during a period from time t1 to t2.

On the other hand, in latch circuit L11, clock inverter CIV1 does not operate at time t1. Therefore, detection signal JUDGE outputted from latch circuit L11 stays at H level, which is the same as in a reset state.

When signal φD1 assumes H level at time t2, clocked inverter CIV2 in latch circuit L10 ceases to operate. At this time, clocked inverter CIV1 therein starts to operate. Therefore, latch circuit L10 enters a state where the circuit latches a result of signal φD2 just before time t2.

On the other hand, in latch circuit L11, at time t2, clocked inverter CIV3 ceases to operate and clocked inverter CIV4 starts to operate. Therefore, latch circuit L11 outputs a result of signal φD2 latched at time t2 as detection signal JUDGE in a period from time t2 to activation of signal WLTRG in the next turn.

With the above operation applied, detection circuit 20 outputs data strobe signal DQS at time t2 as detection signal JUDGE.

Then, description will be given of what detection signal JUDGE is outputted according to a phase difference between data strobe signal DQS and clock signal CLK.

Here, some definitions are given: data strobe signal DQS earlier than clock signal CLK is a data strobe signal DQS1, data strobe signal DQS in synchronism with clock signal CLK is a data strobe signal DQS2 and data strobe signal DQS later than clock signal CLK is a data strobe signal DQS3.

Referring to FIGS. 5 and 6, data strobe signal DQS1 assumes H level at time t2. Hence, detection signal JUDGE in a case of data strobe signal DQS1 is at H level.

Furthermore, data strobe signal DQS3 assumes L level at time t2. Therefore, detection signal JUDGE in a case of data strobe signal DQS3 is at L level.

With the above operation applied, detection circuit 20 can detect a phase difference between data strobe signal DQS and clock signal CLK.

Note that detection circuit 20 can be realized in a circuit configuration other than that of FIG. 1.

Figure 7:
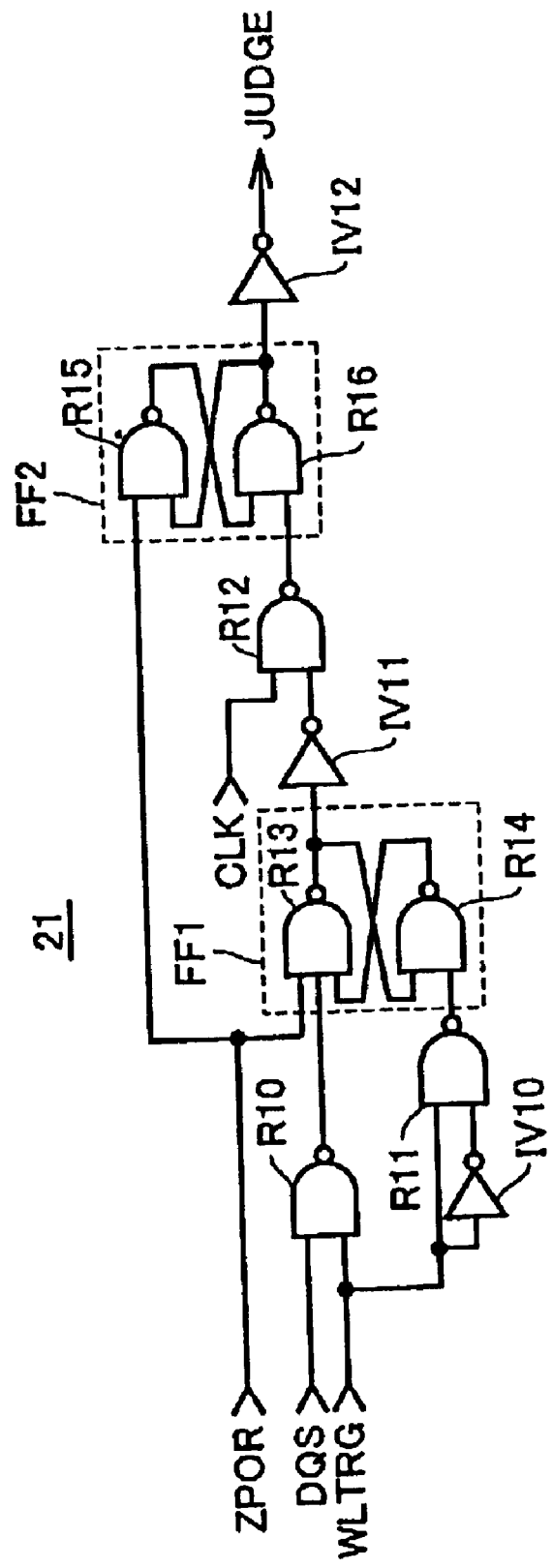
FIG. 7 is a circuit diagram showing another example configuration of the detection circuit.

FIG. 7 is a circuit diagram showing another example configuration of the detection circuit.

Referring to FIG. 7, a detection circuit 21 includes: logic gates R10 to R12; inverters IV10 to IV12; and flip-flops FF1 and FF2.

Flip-flop FF1 is constituted of logic gates R13 and R14. Flip-flop FF2 is constituted of logic gates R15 and R16.

Logic gate R10 receives data strobe signal DQS and signal WLTRG to output a result of a NAND logical operation. In addition, logic gate R11 receives signal WLTRG and an output of inverter IV10 to output a result of a NAND logical operation. Inverter IV10 receives signal WLTRG to invert the signal and to output the inverted signal.

Logic gate R13 in flip-flop FF1 receives power-on reset signal ZPOR, an output signal of logic gate R10 and an output signal of logic gate R14 to output a result of a NAND logical operation. Logic gate R14 receives an output of logic gate R13 and an output of logic gate R11 to output a result of a NAND logical operation.

Logic gate R12 receives clock signal CLK and an output signal of inverter IV11 to output a result of a NAND logical operation. Logic gate R15 in flip-flop FF2 receives power-on reset signal ZPOR and an output signal of logic gate R13 to output a result of a NAND logical operation. Logic gate R16 receives an output signal of logic gate R15 and an output signal of logic gate R12 to output a result of a NAND logical operation. Inverter IV12 inverts an output signal of flip-flop FF2 to output the inverted signal as detection signal JUDGE.

A detection result of detection signal JUDGE outputted from detection circuit 21 having the above configuration is the same as in the case of detection circuit 20.

Referring again to FIGS. 5 and 6, description will be given of operation in detection circuit 21 in a case of data strobe signal DQS1.

Since at time t2, signal WLTRG is at H level and data strobe signal DQS1 is at H level, logic gate R10 in detection circuit 21 outputs a signal at L level. Therefore, flip-flop FF1 outputs a signal at H level. As a result, detection signal JUDGE outputted from inverter IV12 assumes H level.

Then, description will be given of operation in detection circuit 21 in a case of data strobe signal DQS3.

Since at time t2, signal WLTRG is at H level and data strobe signal DQS3 is at L level, logic gate R10 outputs a signal at H level. In addition, logic gate R11 outputs a one shot pulse at L level. Therefore, flip-flop FF1 outputs a signal at L level. As a result, detection signal JUDGE outputted from inverter IV12 is at L level.

With the above operation applied, a detection circuit outputs detection signal JUDGE at H level in a case where data strobe signal DQS is earlier than clock signal CLK. On the other hand, the detection circuit outputs detection signal JUDGE at L level in a case where data strobe signal DQS is later than clock signal CLK. Hence, by using a detection circuit, a phase difference between data strobe signal DQS and clock signal CLK can be determined.

Second Embodiment

Figure 8:
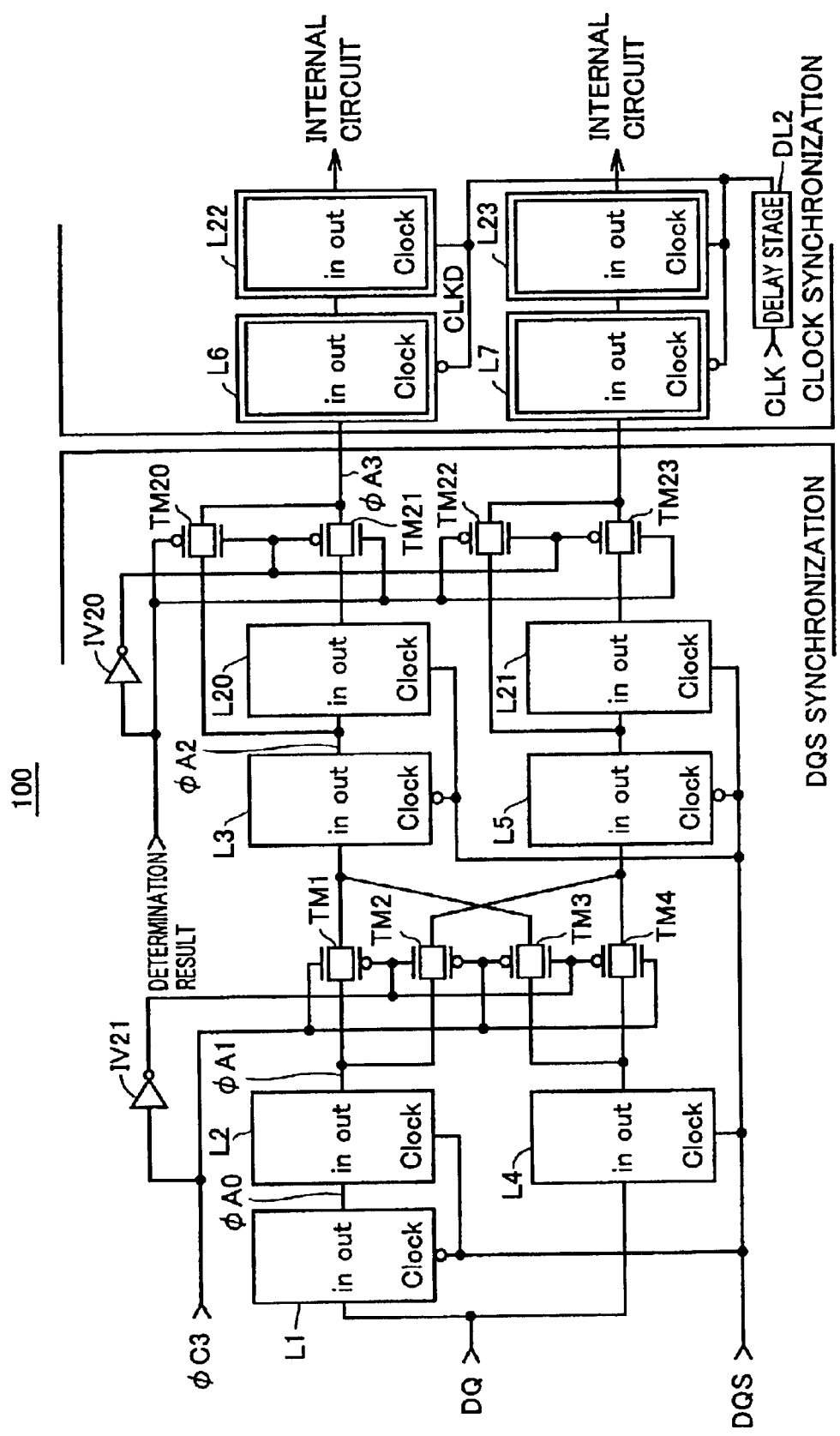
FIG. 8 is a circuit diagram showing a configuration of a data input circuit in a second embodiment of the present invention.

FIG. 8 is a circuit diagram showing a configuration of a data input circuit in a second embodiment of the present invention.

Referring to FIG. 8, a data input circuit 100 includes: latch circuits L20 and L21; transmission gates TM20 to TM23; an inverter IV20; and a delay circuit d12 in addition to the data input circuit 10.

Note that data circuit 100 receives detection signal JUDGE of detection circuit 20 shown FIG. 1 to operate.

Latch circuit L20 is connected between latch circuit L3 and latch circuit L6. Moreover, latch circuit L21 is connected between latch circuit L5 and latch circuit L7.

Transmission gate TM20 is connected between latch circuits L3 and L6 and transmission gate TM21 is connected between latch circuits L20 and L6. Detection signal JUDGE is inputted to the gate of a P channel MOS transistor of transmission gate TM20 and an output signal of inverter IV20 is inputted to the gate of an N channel MOS transistor thereof. Here, inverter IV20 receives detection signal JUDGE to invert the signal. Moreover, an output signal of inverter IV20 is inputted to the gate of a P channel MOS transistor of transmission gate TM21 and detection signal JUDGE is inputted to the gate of an N channel MOS transistor thereof.

Furthermore, transmission TM22 is connected between latch circuits L5 and L7 and transmission gate TM23 is connected between latch circuits L21 and L7. Detection signal JUDGE is inputted to the gate of a P channel MOS transistor of transmission gate TM22 and an output of inverter IV20 is inputted to the gate of an N channel MOS transistor thereof. Still furthermore, an output signal of inverter IV20 is inputted to the gate of a P channel MOS transistor of transmission gate TM23 and detection signal JUDGE is inputted to the gate of an N channel MOS transistor thereof.

Delay circuit DL2 delays clock signal CLK to supply the delayed signal as a clock signal CLKD to latch circuits L6, L22, L7 and L23.

Figure 26:
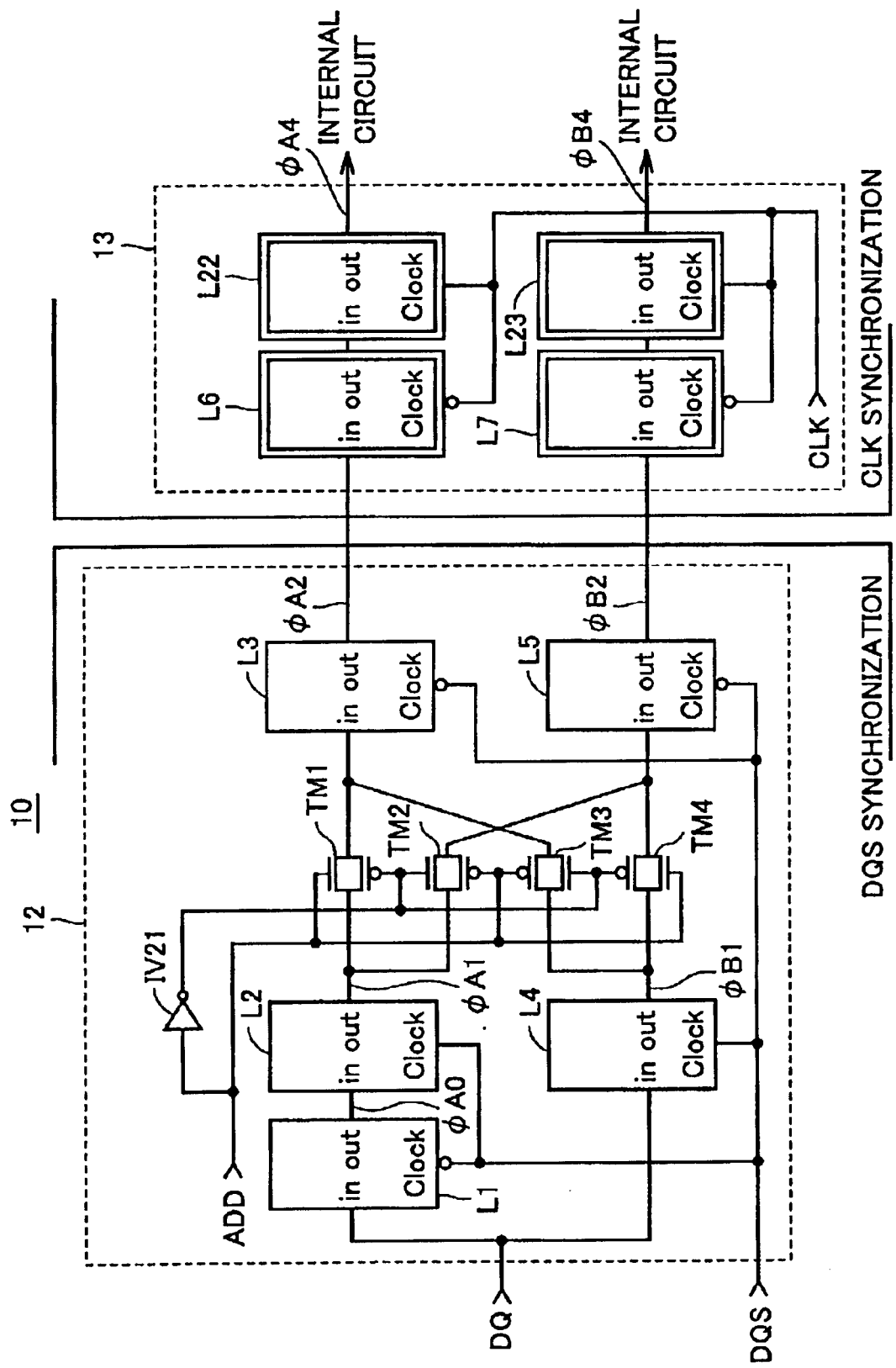
FIG. 26 is a block diagram showing a configuration of a data input circuit of DDR SDRAM.
Figure 27:
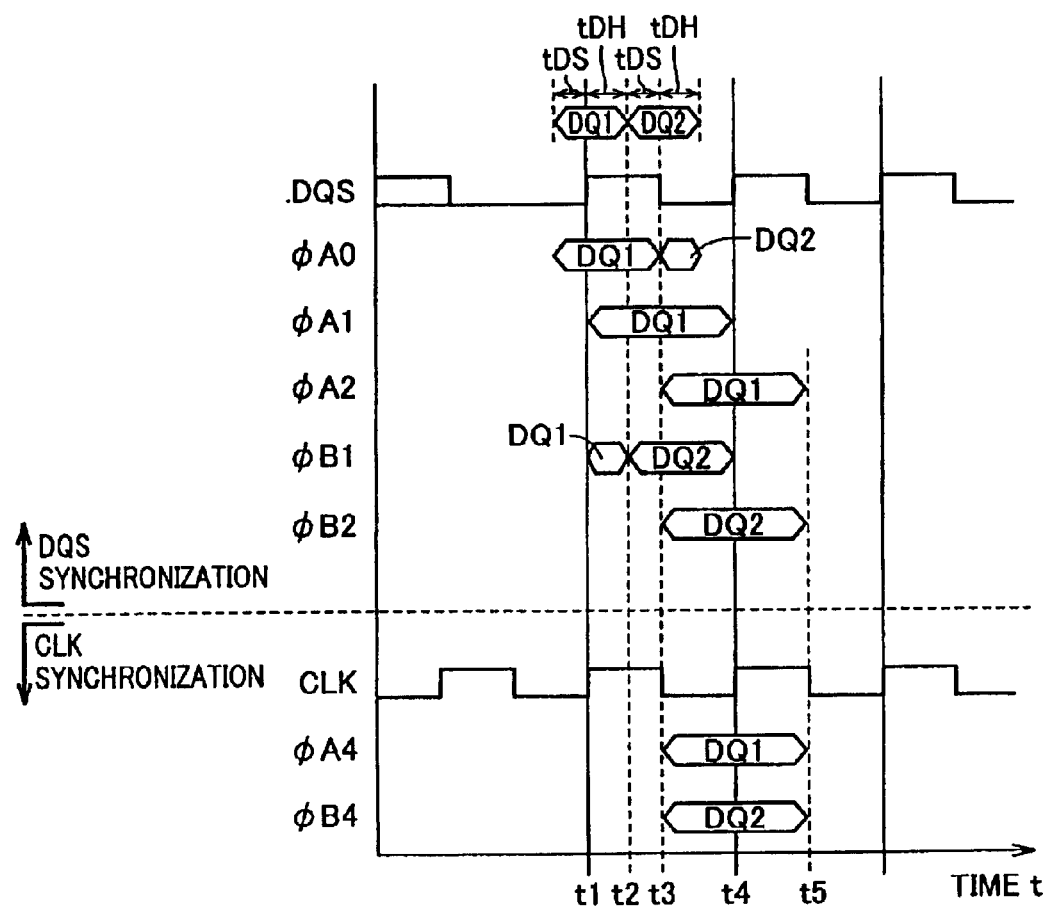
FIG. 27 is a timing chart showing operation in the data input circuit of FIG. 26.
Figure 28:
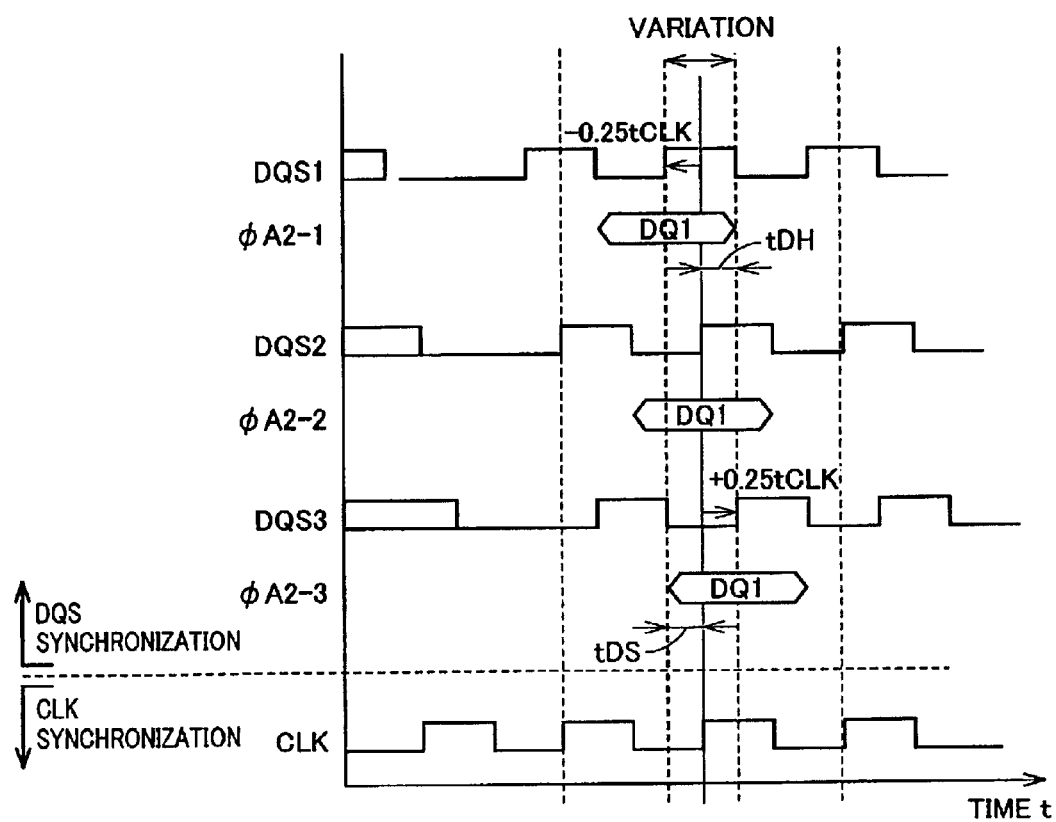
FIG. 28 is a timing chart showing operation in a data input circuit in a case where a phase difference is produced between a clock signal and a data strobe signal.
Figure 29:
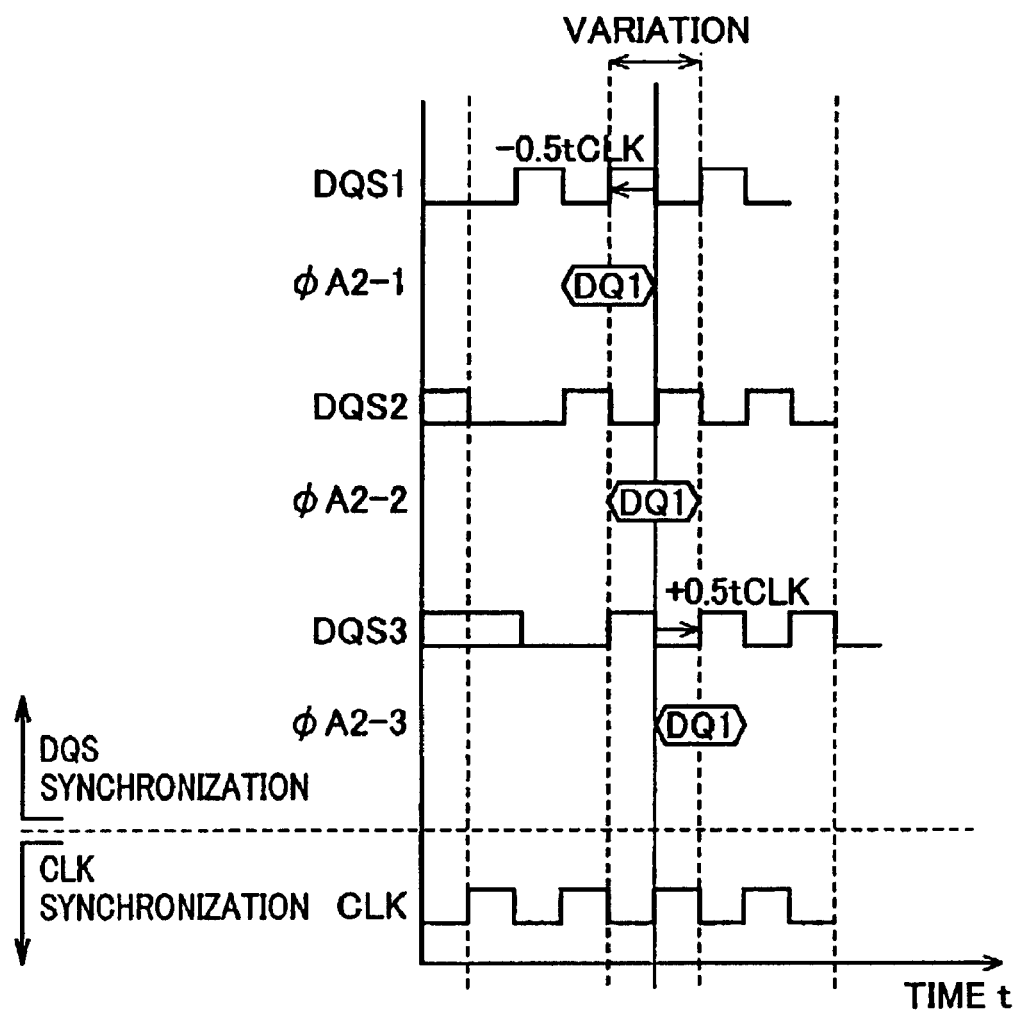
FIG. 29 is a timing chart showing operation in a data input circuit in a case where a phase difference is produced between a clock signal and the data strobe signal at an operating frequency twice times that in FIG. 28.

Since the other parts of the circuit configuration are the same as those of the configuration of FIG. 26, no description thereof is repeated.

Figure 9:
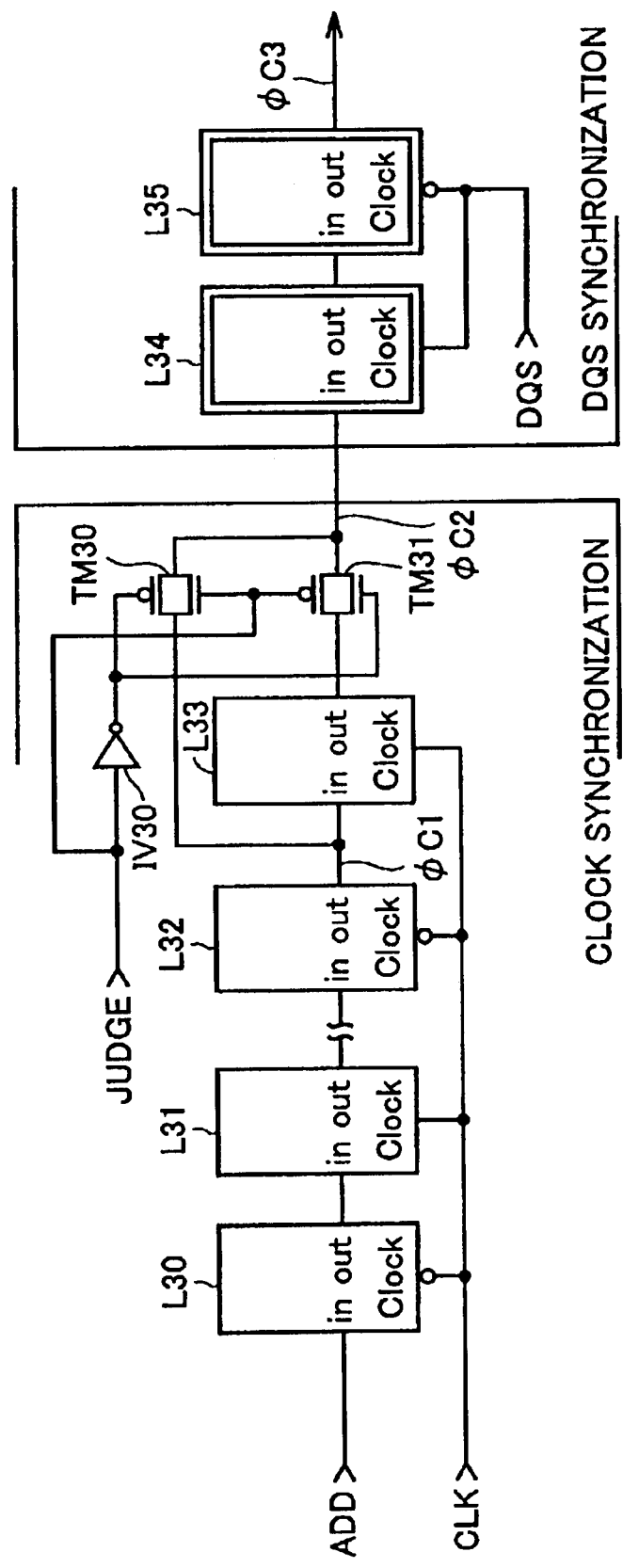
FIG. 9 is a circuit diagram showing a configuration of an address input circuit in the second embodiment of the present invention.

FIG. 9 is a circuit diagram showing a configuration of an address input circuit in the second embodiment of the present invention.

Referring to FIG. 9, an address circuit 30 includes latch circuits L30 to L35 transmission gates TM30 and TM31 and an inverter IV30.

Address input buffer 31 in FIG. 1 is connected with latch circuit L30. Furthermore, latch circuits L30 to L35 are connected in series with each other.

Latch circuits L30 to L33 receive clock signal CLK at the respective clock terminals. Latch circuits L30 to L32 receive an input signal at the respective input terminals when clock signal CLK is at L level and latches an input signal when clock signal CLK is at H level. In addition, latch circuits L31 and L33 receive an input signal at the respective input terminals when clock signal CLK is at H level and latches an input signal when clock signal CLK is at L level.

Latch circuits L34 and L35 receive data strobe signal DQS at the respective clock terminals. Latch circuit L34 receives an input signal from the input terminal when data strobe signal DQS is at H level and latches the input signal when data strobe signal DQS is at L level. Latch circuit L35 receives an input signal from the input terminal when data strobe signal DQS is at L level and latches the input signal when data strobe signal DQS is at H level.

Transmission gate TM30 is connected between latch circuits L32 and L34. An output signal of inverter IV30 is inputted to the gate of a P channel MOS transistor of transmission gate TM30. Note that inverter IV30 receives detection signal JUDGE to invert the signal and output the inverted signal. Detection signal JUDGE is inputted to the gate of an N channel MOS transistor of transmission gate TM30.

Transmission gate TM31 is connected between latch circuits L33 and L34. Detection signal JUDGE is inputted to the gate of a P channel MOS transistor of transmission gate TM31 and an output signal of inverter IV30 is inputted to the gate of an N channel MOS transistor thereof.

Some definitions are given: an output signal of latch circuit L32 is signal φC1, an output signal of latch circuit L33 is signal φC2 and an output signal of latch circuit L35 is signal φC3.

Description will be given of operation in data input circuit 100 and address input circuit 30, combined, having the above circuit configuration.

Figure 10:
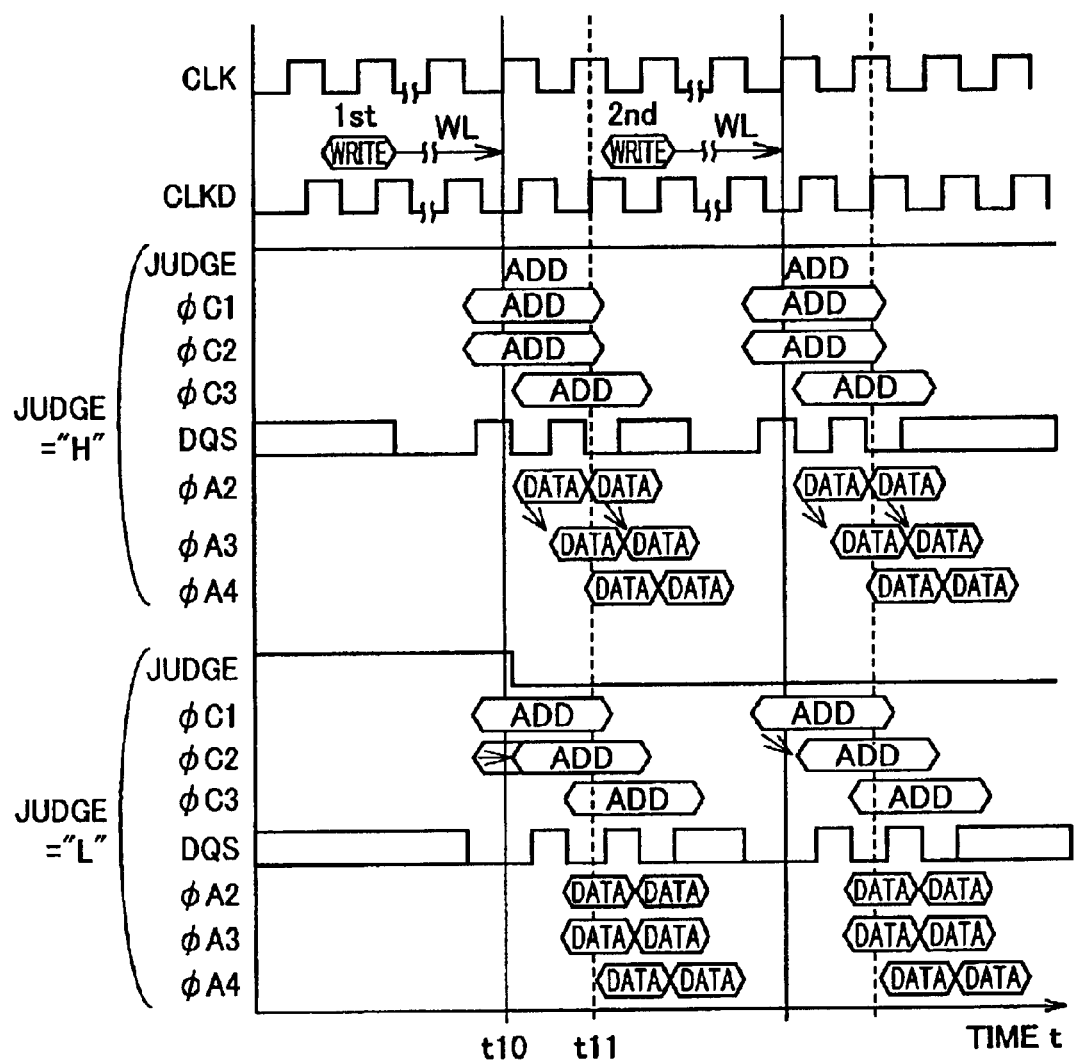
FIG. 10 is a timing chart showing operation in a data input circuit and an address input circuit, combined.

FIG. 10 is a timing chart showing operation in data input circuit 100 and address input circuit 30, combined.

First of all, description will be given of a case where at time t10, detection circuit 20 outputs detection signal JUDGE at H level.

When detection signal JUDGE is at H level, data strobe signal DQS is earlier than clock signal CLK.

Here, attention is paid to address circuit 30. Transmission gate TM30 in address input circuit 30 is turned on while transmission gate TM31 is turned off. Therefore, output signal φC1 of latch circuit L32 is not inputted to latch circuit L33, but to latch circuit L34. That is, signal φC1 is inputted to latch circuit L34 without being delayed. Latch circuit L34 can capture data of signal φC2 in a period when data strobe signal DQS is at H level. Hence, signal φC3 is outputted as a signal obtained by delaying signal φC2 till a trailing edge of data strobe signal DQS, that is as a signal in synchronism with data strobe signal DQS.

In succession, attention is paid to data input circuit 100. Transmission gate TM20 in data input circuit 100 is turned off while transmission gate TM21 is turned off. Hence, output signal φA2 of latch circuit L3 is inputted to latch circuit L20. Hence, signal φA3 inputted to latch circuit L6 is a signal later than signal φA2 by 0.25 tCLK. Delay circuit DL2 outputs clock signal CLKD obtained by delaying clock signal CLK by 0.25 tCLK. Latch circuits L6 and L22 output signal φA4 obtained by delaying signal φA3 at time t11. Note that since clock signal CLKD is a signal in synchronism with clock signal CLK, data signal φA4 is synchronized with clock signal CLK.

With the above operation applied, a data signal before being synchronized with clock signal CLK by a detection signal is delayed in a case where data strobe signal DQS is earlier than clock signal CLK. Hence, data signal in synchronism with data strobe signal DQS can be synchronized with clock signal CLK.

Then, description will be given of a case where detection circuit 20 outputs detection signal JUDGE at L level at time t10.

When detection signal JUDGE is at L level, data strobe signal DQS is later than clock signal CLK.

Here, attention is paid to address input circuit 30. Transmission gate TM31 in address input circuit 30 is turned on, while transmission gate TM30 therein is turned off. Therefore, output signal φC1 of latch circuit L32 is inputted to latch circuit L33. Therefore, signal φC2 outputted from latch circuit L33 is a signal later than signal φC1 by 0.5 tCLK. As a result, latch circuit L34 can capture data of signal φC2 at all times. Hence, signal φC3 is outputted as a signal obtained by delaying signal φC2 till a trailing edge of data strobe signal DQS, that is as a signal in synchronism with data strobe signal DQS.

In succession, attention is paid to data input circuit 100. A transmission path of data signal φA1 is determined by address signal φC3. That is, when address signal φC3 is at H level, signal φA1 is inputted to latch circuit L3. Furthermore, when address signal φC3 is at L level, signal φA1 is inputted to latch circuit L5. Supply and reception of data is performed in synchronism with data strobe signal DQS. Therefore, when address signal φC3 is inputted in synchronism with clock signal CLK, or alternatively when an address signal is inputted constantly at the same timing independently of phases of clock signal CLK and data strobe signal DQS, a data signal is not transmitted along a correct transmission path.

However, as described above, address signal φC3 is also delayed in correspondence to a timing of data strobe signal DQS later than clock signal CLK and synchronized with data strobe signal DQS. Hence, a data signal has no chance to take a wrong transmission path.

Note that transmission gate TM20 in data input circuit 100 is turned on, while transmission gate TM21 therein is turned off. Therefore, output signal φA2 of latch circuit L3 is not inputted to latch circuit L20. Therefore, φA3 becomes a signal in synchronism with signal φA2. As a result, latch circuits L6 and L22 output signal φA4 obtained by delaying signal φA3 at time t11. Note that since clock signal CLKD is a signal in synchronism with clock signal CLK, data signal φA4 is synchronized with clock signal CLK.

With the above operation applied, in a case where data strobe signal DQS is later than clock signal CLK, address signal φC3 is delayed in synchronism with data strobe signal DQS. As a result, a data signal does not take a wrong transmission path. Furthermore, by short circuiting signals φA2 and φA3, the capture at clock signal CLKD is enabled; therefore, a data signal in synchronism with data strobe signal DQS can be synchronized with clock signal CLK.

Third Embodiment

Figure 11:
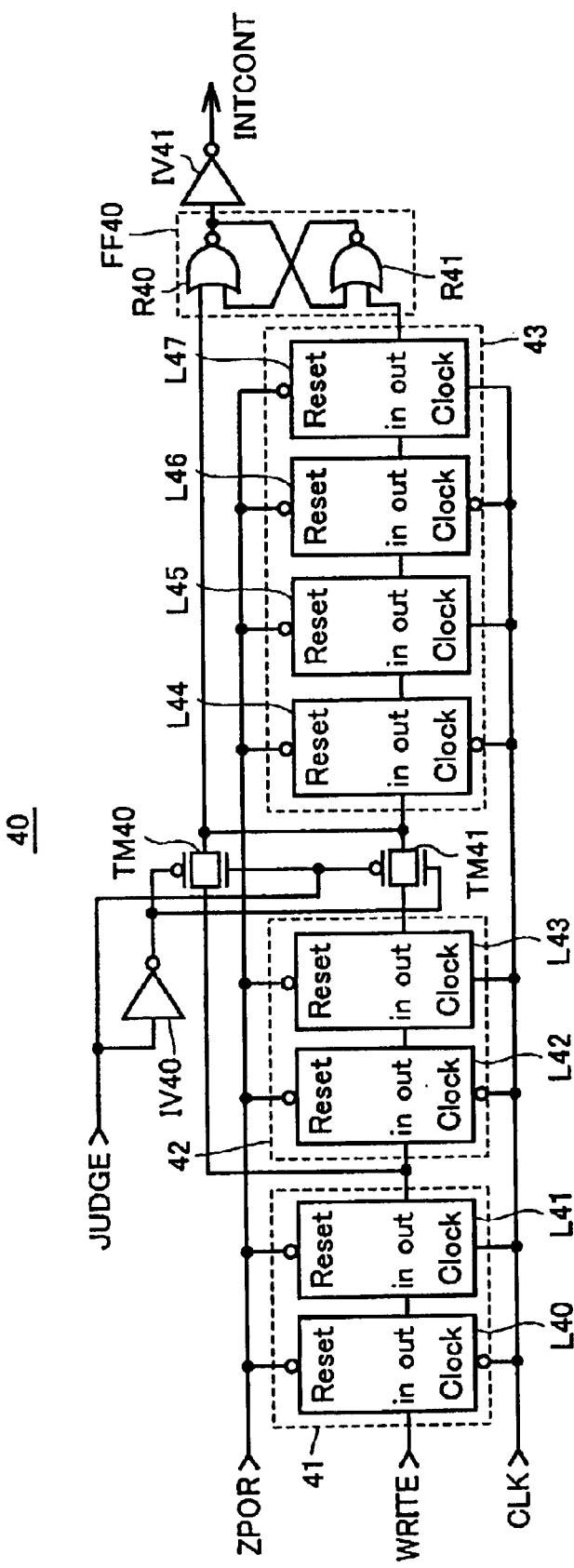
FIG. 11 is a circuit diagram showing a configuration of a control circuit in a third embodiment of the present invention.

FIG. 11 is a circuit diagram showing a configuration of control circuit 40 in a third embodiment of the present invention.

Referring to FIG. 11, control circuit 40 includes a control signal activation stage 41 a control signal delay stage 42 a control signal pulse width adjustment stage 43 a flip-flop FF 40 inverters IV40 and IV41 and transmission gates TM40 and TM41.

Control signal activation stage 41 includes latch circuits L40 and L41. Control signal delay stage 42 includes latch circuits L42 and L43. Control signal pulse width adjustment stage 43 includes latch circuits L44 to L47.

Latch circuits L40 to L47 are connected in series. Power-on reset signal ZPOR is inputted to the reset terminals of latch circuits L40 to L47 and clock signal CLK is inputted to the clock terminals. Latch circuits L40, L42, L44 and L46 receive an input signal from the input terminals when clock signal CLK is at L level and latch the input signal when clock signal CLK is at H level. On the other hand, latch circuits L41, L43, L45 and L47 receive an input signal from the input terminals when clock signal CLK is at H level and latch the input signal when clock signal CLK is at L level. Write signal WRITE is inputted to the input terminal of latch circuit L40. Note that a signal inputted to the input terminal of latch circuit L40 has only to be a control signal such as a read signal READ.

Flip-flop FF40 is constituted of logic gates R40 and R41. Logic gate R40 has two input terminals and one output terminal. Furthermore, logic gate R41 also has two input terminals and one output terminal. One input terminal of logic gate R40 is connected to the output terminals of latch circuits L41 and L43. Furthermore, the other input terminal of logic gate R40 is connected to the output terminal of logic gate R41. One input terminal of logic gate R41 is connected to the output terminal of logic gate R40. Furthermore, the other input terminal thereof is connected to the output terminal of latch circuit L47. Logic gate R40 receives signals from the two input terminals to output a result of a NAND logical operation thereon. Logic gate R41 also receives signals from the two input terminals to output a result of a NAND logical operation thereon.

Transmission gate TM40 is connected between the output terminal of latch circuit L41 and the input terminal of logic gate R40. An output signal of inverter IV40 is inputted to the gate of a P channel MOS transistor of transmission gate TM40 and detection signal JUDGE is inputted to the gate of an N channel MOS transistor thereof. Note that inverter IV40 receives detection signal JUDGE to invert the signal and output the inverted signal.

Transmission gate TM41 is connected between the output terminal of latch circuit L43 and the input terminal of latch circuit L44. Detection signal JUDGE is inputted to the gate of a P channel MOS transistor of transmission TM41 and an output signal of inverter IV40 is inputted to the gate of an N channel NOS transistor thereof.

An output signal of flip-flop FF40 is transmitted to inverter IV41. Inverter IV40 inverts an output signal of flip-flop FF40 to output the inverted signal as a control signal INTCONT.

Description will be given of operation in control circuit 40 showing the above circuit configuration.

Figure 12:
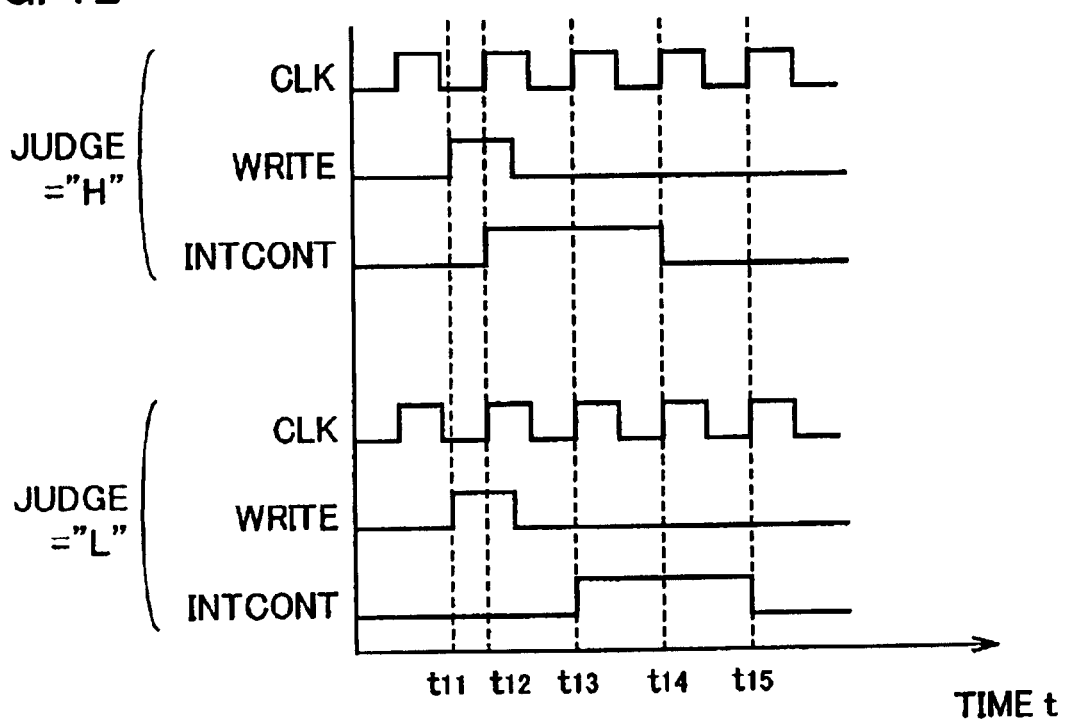
FIG. 12 is a timing chart showing operation in a control circuit.

FIG. 12 is a timing chart showing operation in control circuit 40.

Referring to FIG. 12, description gets started with operation in control circuit 40 when detection circuit 20 outputs detection signal JUDGE at H level.

When detection signal JUDGE is at H level, transmission gate TM40 is turned on, while transmission gate TM41 is turned off. As a result, an output signal of latch circuit L41 is inputted to the input terminal of logic gate R40 in flip-flop FF40 and the input terminal of latch circuit L44.

As a result of the above operation, when write signal WRITE is driven to H level at time t11, control signal INTCONT assumes H level at time t12 when clock signal CLK rises after time t11. On the other hand, write signal WRITE inputted to latch circuit L44 at time t12 is outputted from latch circuit L47 upon a lapse of 2tCLK. Therefore, control signal INTCONT falls to L level at time t14 when 2tCLK passes from time t12.

Then, description will be given of operation in control circuit 40 when detection circuit 20 outputs detection signal JUDGE at L level.

When detection signal JUDGE is at L level, transmission gate TM40 is turned on, while transmission gate TM41 is turned off. As a result, an output signal of latch circuit L43 is inputted to the input terminal of logic gate R40 in flip-flop FF40. That is, when detection signal JUDGE is at H level, a signal inputted to logic gate R40 is a signal passing through latch circuits L40 and L41, whereas when detection signal is at L level, a signal inputted to logic gate R40 is a signal passing through latch circuits L40 to L43. As a result, control signal INTCONT when detection signal JUDGE is at L level is activated to H level at time t13 later than a time when detection signal JUDGE is at H level by 1 tCLK.

On the other hand, an output signal of latch circuit L43 is inputted to latch circuit L44. Then, the output signal passes through latch circuits L44 to L47 and is inputted to the input terminal of logic gate R41. Hence, control signal INTCONT falls at time t15 when 2tCLK has passed from time t13.

As a result of the above operation, an activation period of control signal INTCONT can be adjusted by detection signal JUDGE.

Therefore, operations in internal circuits of a semiconductor memory device can be adjusted according to a phase difference between data strobe signal DQS and clock signal CLK.

Then, description will be given of control on data input buffer as a concrete example of a control method for an internal circuit using control signal INTCONT.

Figure 13:
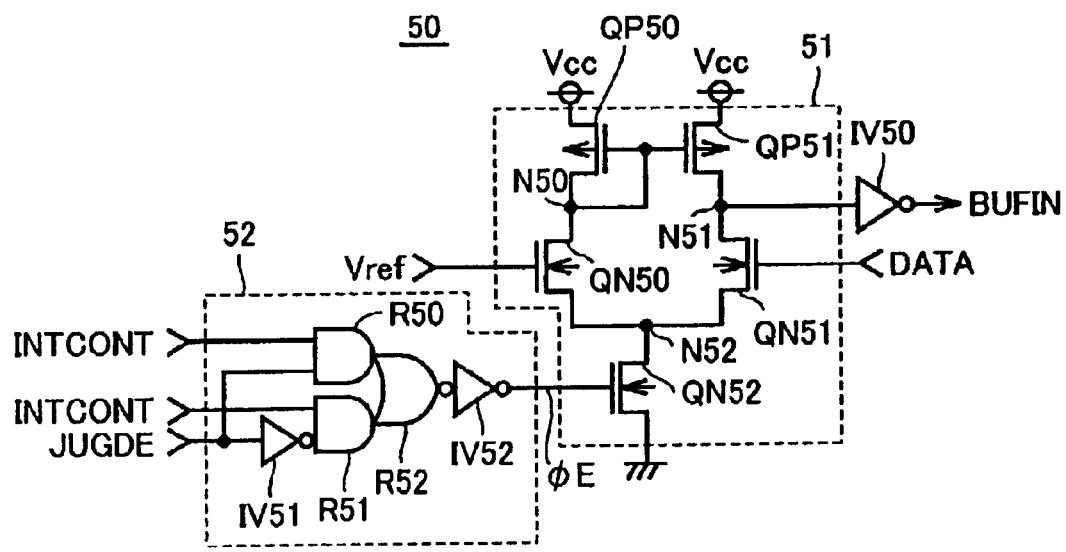
FIG. 13 is a circuit diagram showing a configuration of a data input buffer controlled by the control signal.

FIG. 13 is a circuit diagram showing a configuration of a data input buffer controlled by control signal INTCONT.

Referring to FIG. 13, a data input buffer 50 includes: a differential amplifier circuit 51, an inverter IV50 and an input buffer activation control circuit 52.

Differential amplifier circuit 51 includes: P channel MOS transistors QP50 and QP51; and N channel MOS transistors QN50 to QN52. Transistors QP50 and transistor QN50 are connected in series with each other. The source of transistor QP50 is connected to an external power supply node Vcc and the drain and gate thereof are both connected to the drain of transistor QN50. Transistor QP51 and transistor QN51 are also connected in series with each other. The source of transistor QP51 is connected to external power supply node Vcc and the gate thereof is connected to the gate of transistor QP50. Therefore, transistors QP50 ad QP51, and transistors QN50 and QN51 constitute a current mirror circuit. The sources of transistors QN50 and QN51 are both connected to the drain of transistor QN52. The source of transistor QN52 is connected to a ground node GND. When transistor QN52 is turned on, differential amplifier circuit 51 differentially amplifies a potential level of a reference potential Vref inputted to the gate of transistor QN50 and a potential level of a data signal inputted to the gate of transistor QN51 to output a result of the differential amplification from a node N51, which is a connection point between transistor QP51 and transistor QN51. A signal outputted from node N51 is inverted in inverter IV50 to transmit the inverted signal to an internal circuit as an internal data signal BUFIN.

Input buffer activation control circuit 52 outputs a signal φE to the gate of transistor QN52. Input buffer activation control circuit 52 includes inverters IV51 and IV52 and logic gates R50 to R52.

Logic gate R50 receives control signal INTCONT and detection signal JUDGE to output a result of a NAND logical operation. Logic gate R51 receives control signal INTCONT and an output signal of inverter IV51 to output a result of an AND logical operation. Inverter IV51 receives detection circuit JUDGE to invert the signal and to output the inverted signal.

Logic gate R52 receives an output signal of logic gate R50 and an output signal of logic gate R51 to output a result of a NOR logical operation. Inverter IV52 inverts an output of logic gate R52 to output the inverted signal as signal φE.

Input buffer activation control circuit 52 outputs control signal INTCONT corresponding to detection signal JUDGE as signal φE when detection signal JUDGE is at H level, while outputting control signal INTCONT corresponding to detection signal JUDGE as signal φE when detection signal JUDGE is L level. In a case where detection circuit 20 performs no detection, signal φE is at L level.

Description will be given of operation in data input buffer 50 showing the above circuit configuration.

Figure 14:
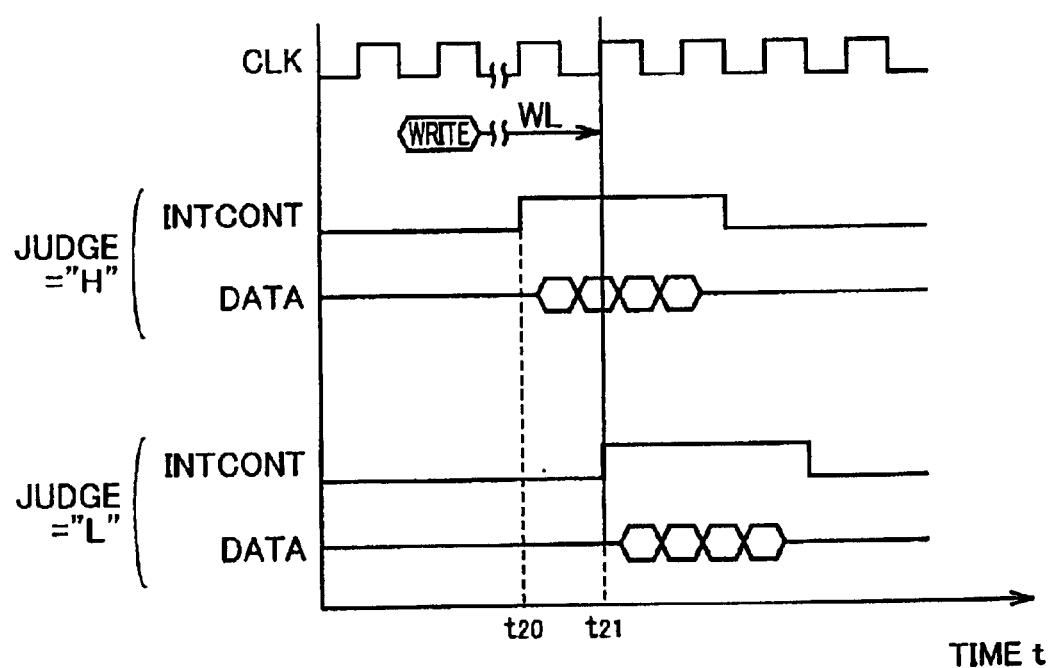
FIG. 14 is a timing chart showing operation in a data input buffer.

FIG. 14 is a timing chart showing operation in data input buffer 50.

Referring to FIG. 14, first of all, description gets started with operation in data input buffer 50 when detection signal JUDGE is at H level.

When detection signal JUDGE is at H level, data strobe signal DQS is earlier than clock signal CLK. Therefore, a data signal is inputted to data input buffer 50 at a time earlier than time t21 when a write latency passes after write signal WRITE is activated.

At this time, control circuit 40 activates control signal INTCONT at time t20. Note that a time difference from activation of write signal WRITE till activation of control signal INTCONT is adjusted by the number of latch circuits in control signal activation stage 41.

Furthermore, a pulse width of a control signal is set to be equal to or longer than a period when a data signal is active. Note that a pulse width of a control signal can be adjusted by the number of latch circuits in control signal pulse width adjustment stage 43.

With the above operation applied, data input buffer 50 can be operated when detection signal JUDGE is at H level only in a period when a data signal is inputted to an input buffer.

Then, description will be given of operation in data input buffer 50 when detection signal JUDGE is at L level.

When detection signal JUDGE is at L level, data strobe signal DQS is later than clock signal CLK. Therefore, a data signal is inputted to data input buffer 50 at time later than time t21 when a write latency has passed. Here, it is assumed that the data signal is inputted to data input buffer 50 later than time t21.

At this time, since detection signal JUDGE is at L level, control circuit 40 operates control signal delay stage 42. As a result, control signal INTCONT is activated at time t21. Therefore, control circuit 40 can adjust a timing of activation of control signal INTCONT even when detection signal JUDGE is L level. Therefore, data input buffer 50 can be operated only when receiving a data signal. Note that by adjusting the number of latch circuits in control signal delay stage 42, control circuit 40 can adjust a timing of activation of control signal INTCONT.

With the above operation applied, data input buffer 50 can be operated only when receiving a data signal. Therefore, correct data can be inputted, regardless of a phase difference between data strobe signal DQS and clock signal CLK. Furthermore, data input buffer 50 ceases its operation other than when a data signal is inputted. Therefore, reduction in power consumption is enabled.

Fourth Embodiment

Figure 15:
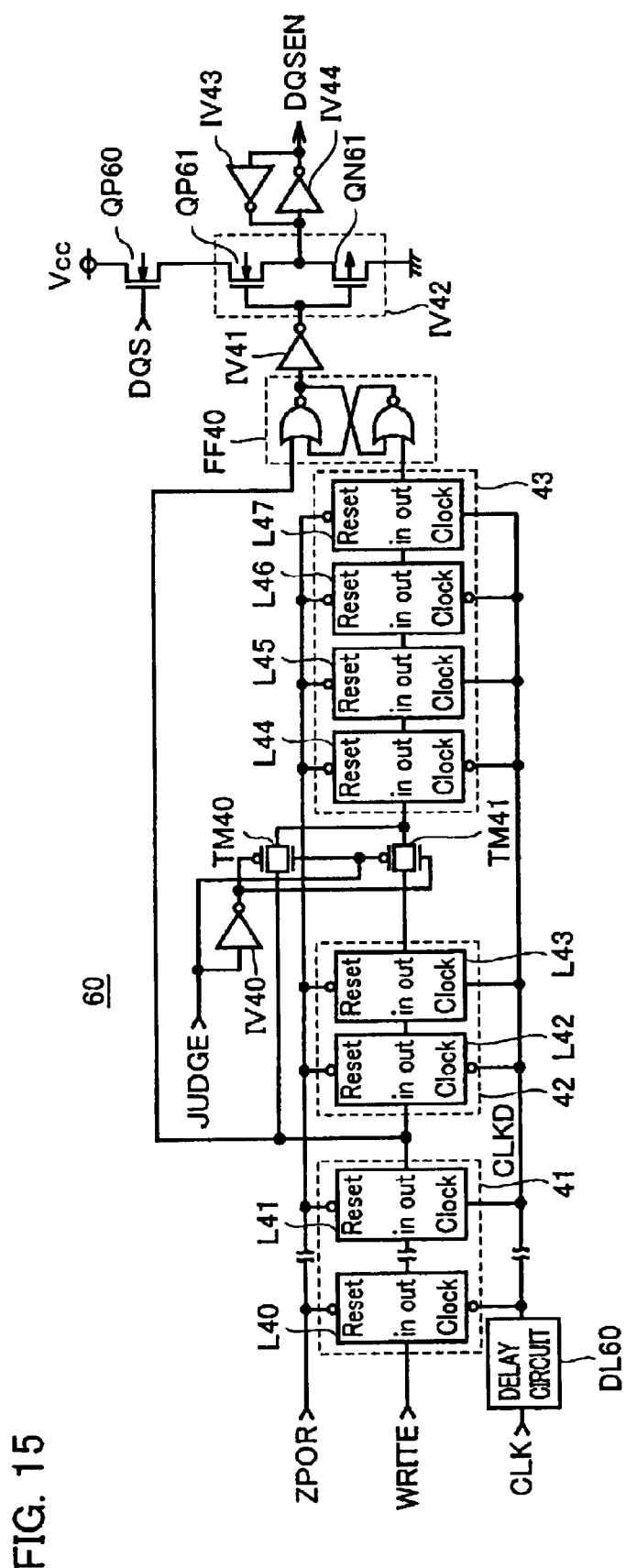
FIG. 15 is a circuit diagram showing a configuration of a control circuit in a fourth embodiment of the present invention.

FIG. 15 is a circuit diagram showing a configuration of a control circuit in a fourth embodiment of the present invention.

Referring to FIG. 15, in comparison with control circuit 40 shown in FIG. 11, a control circuit 60 additionally includes inverters IV42, IV43 and IV44 a P channel MOS transistor QP60 and a delay circuit DL60.

Inverter IV42 is connected in series with inverter IV41. Inverter IV42 is constituted of a P channel MOS transistor QP61 and an N channel MOS transistor QN61, connected in series to each other. The source of transistor QN61 is connected to ground node GND. Transistor QP60 is connected in series to transistor QP61. The source of transistor QP60 is connected external power supply node Vcc and the drain thereof is connected to transistor QP61. Data strobe signal DQS is inputted to the gate of transistor QP60.

Inverter IV44 is connected in series to inverter IV42. The input terminal of inverter IV43 is connected to the output terminal of inverter IV44 and the output terminal of inverter 43 is connected to the input terminal of inverter IV44. Therefore, inverters IV43 and IV44 function as a latch circuit. Inverter IV44 inverts an output signal of inverter IV42 to output the inverted signal as a control signal DQSEN.

When data strobe signal DQS is at H level, that is when data is in synchronism therewith, transistor QP60 is turned off. Therefore, when data strobe signal DQS is at L level, inverter IV42 is turned off. At this time, inverter IV44 outputs a signal that inverters IV43 and IV44 latch, as control signal DQSEN.

Delay circuit DL60 delays clock signal CLK to output clock signal CLKD. Clock signal CLKD is inputted to the clock terminals of latch circuits L41 to L47.

Since the other parts of the configuration is the same as those of the configuration of control circuit 40 shown in FIG. 11, no description thereof is repeated.

Figure 16:
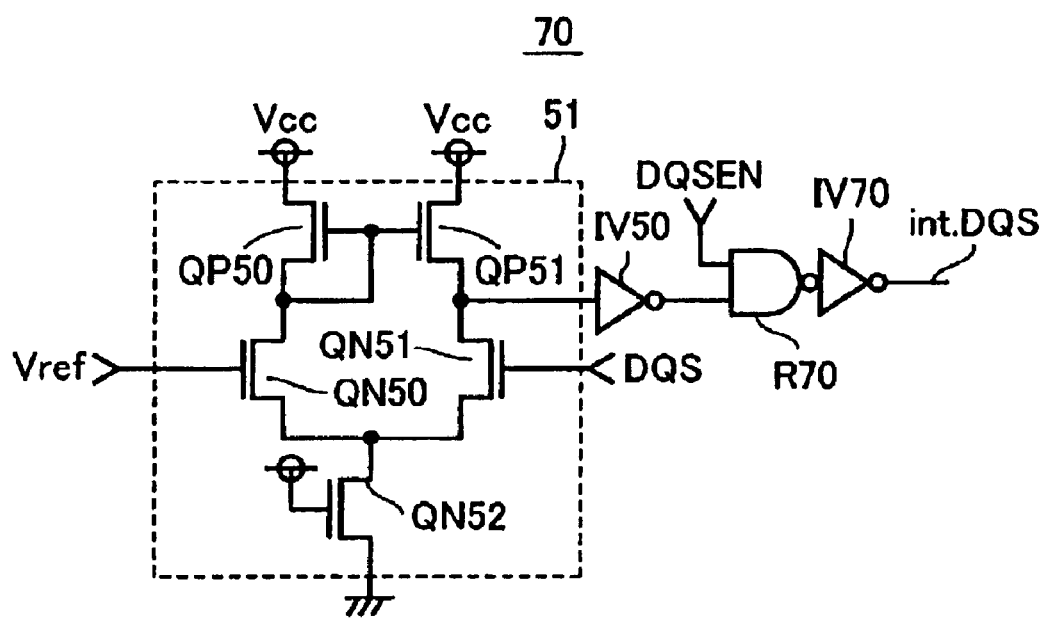
FIG. 16 is a circuit diagram showing a configuration of a data input buffer in the fourth embodiment.

FIG. 16 is a circuit diagram showing a configuration of data input buffer 70 in the fourth embodiment.

Referring to FIG. 16, a data input buffer 70 includes a differential amplifier circuit 51, inverters IV50 and IV70 and a logic gate R70.

A configuration of differential amplifier circuit 51 is the same as that of the differential amplifier circuit 51 of FIG. 15. In differential amplifier circuit 51, external power supply node Vcc is inputted to the gate of transistor QN52. Furthermore, data strove signal DQS is inputted to the gate of transistor QN51.

Inverter IV50 receives an output signal of differential amplifier circuit 51 to invert the signal and output the inverted signal. Logic gate R70 receives an output signal of inverter IV50 and control signal DQSEN outputted from control circuit 60 to output a result of a NAND logical operation. Inverter IV70 inverts an output signal of logic gate R70 to output the inverted signal as internal data strobe signal int.DQS.

Description will be given of operation in control circuit 60 and data input buffer 70, combined, showing the above circuit configuration.

Figure 17:
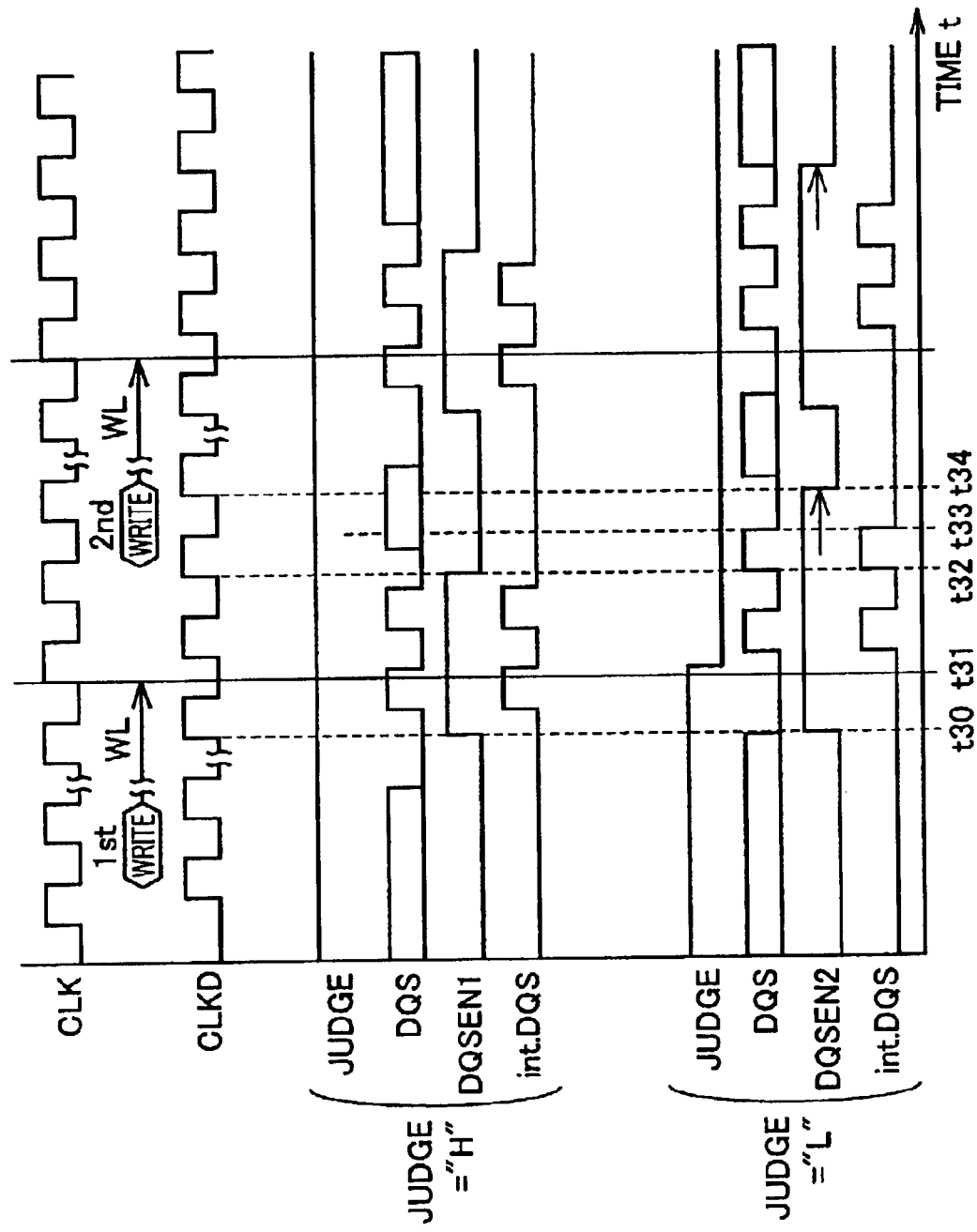
FIG. 17 is a timing chart showing operation in a control circuit and a data input buffer, combined.

FIG. 17 is a timing chart showing operation in control circuit 60 and data input buffer 70, combined.

Referring to FIG. 17, first of all, description gets started with operation in control circuit 60 and data input buffer 70, combined, when detection signal JUDGE is at H level.

A time when a write latency has passed after write signal WRITE is activated is indicated by time t31 by definition. Detection circuit 20 outputs detection signal JUDGE at time t31.

Control circuit 60 inputs write signal WRITE to latch circuit L40 and activates control signal DQSEN at time t30 when a prescribed time has passed thereafter. Note that the prescribed time can be adjusted by the number of latch circuits in control signal activation stage 41 and a delay amount of delay circuit DL60. Furthermore, in order to activate control signal DQSEN, transistor QN61 has only to be turned on. Therefore, control signal DQSEN is activated without depending on data strobe signal DQS. However, in order to deactivate control signal DQSEN, transistor QP61 is required to be turned on. Therefore, control signal DQSEN can be deactivated only in a period when data strobe signal DQS is at L level.

When detection signal JUDGE is at H level, transmission gate TM40 is turned on, while transmission gate TM41 is turned off. Therefore, control signal delay stage 42 does not function. As a result, a pulse width of control signal DQSEN depends on the number of latch circuits in control signal pulse width adjustment stage 43 and an operating state of inverter IV42. That is, in a case where inverter IV42 is in operation, control signal DQSEN is driven to L level when a signal outputted from control signal pulse width determination stage assumes H level. Furthermore, if inverter IV42 is not in operation when a signal outputted from control signal pulse width determination stage assumes H level, that is if data strobe signal DQS is at H level, control signal DQSEN keeps its active state till data strobe signal DQS comes to assume L level. When data strobe signal has come to be at L level, control signal DQSEN also assumes L level.

In FIG. 17, data strobe signal DQS is at L level at time t32 when 2tCLK has passed after control signal DQSEN is activated.

Data buffer 70 receives data strobe signal DQS only in a period when control signal DQSEN is active to output the signal as internal data strobe signal int.DQS. Therefore, data strobe signal DQS in a high impedance state at time t33 is not captured as an internal signal.

With the above operation applied, indefinite input can be prevented. Therefore, a malfunction of a semiconductor memory device can be prevented.

Then, description will be given of operation in control circuit 60 and data input buffer 70, combined, when detection signal JUDGE is at L level.

After control signal DQSEN is activated at time t30, detection signal JUDGE outputted from detection circuit 20 is driven to L level at time t31, As a result, at time t31, transmission gate TM40 in control circuit 60 is turned off, while transmission gate TM41 therein is turned on. Therefore, control signal delay stage 42 begins to function. As a result, a pulse width of control signal DQSEN is extended by one tCLK, which is produced by control signal delay stage, and control signal DQSEN assumes L level at time t34.

As a result, data input buffer 70 receives data strobe signal DQS in a period when control signal DQSEN is active to output the signal as internal data strobe signal int.DQS.

With the above operation applied, even in case where data strobe signal DQS is later than clock signal CLK, data input buffer can correctly transmit data into the interior by extending a pulse width of control signal DQSEN. As a result, indefinite input can be prevented. Therefore, a malfunction of a semiconductor memory device can be prevented.

Fifth Embodiment

Figure 18:
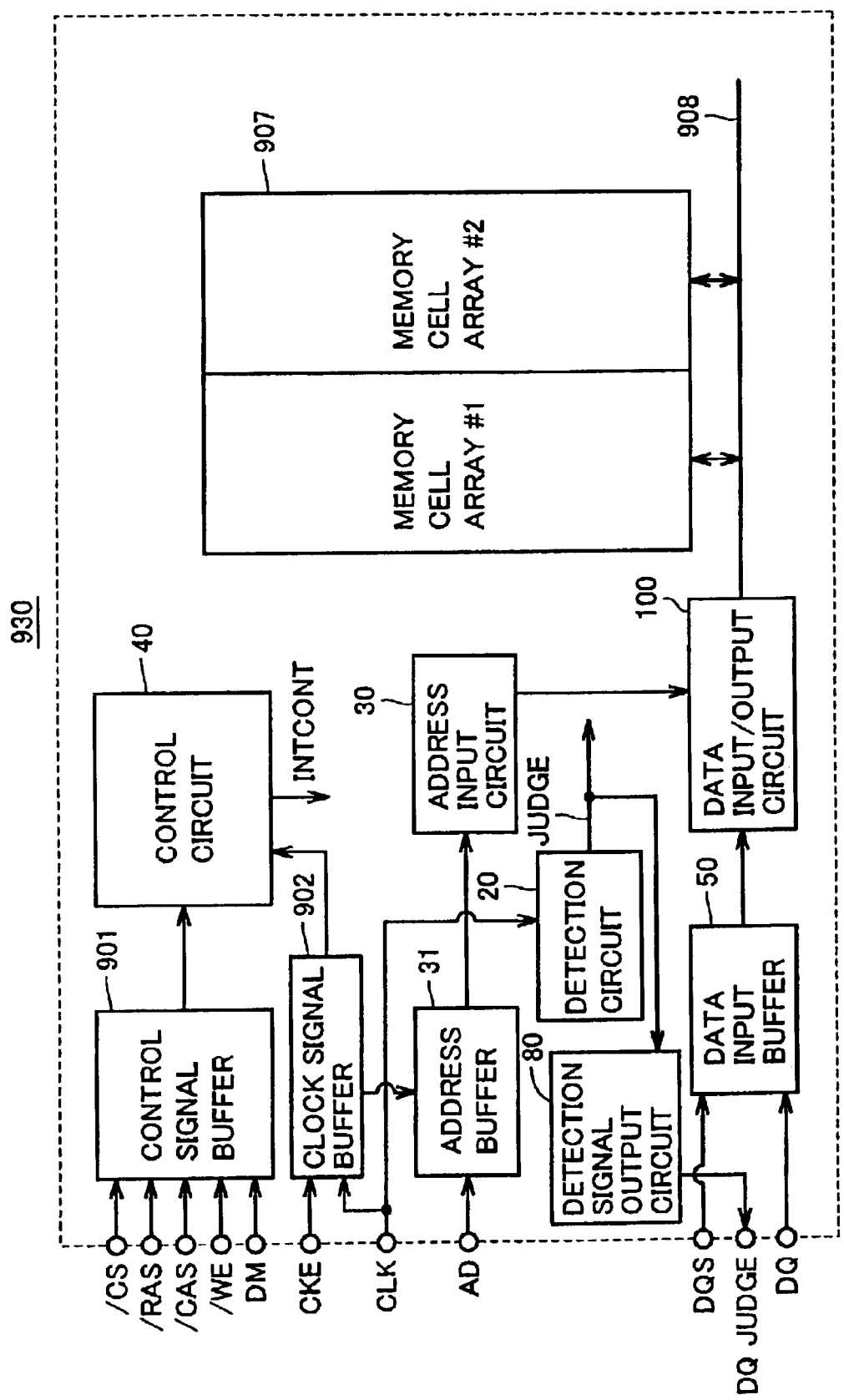
FIG. 18 is a block diagram showing a configuration of a semiconductor memory device in a fifth embodiment of the present invention.

FIG. 18 is a block diagram showing a configuration of a semiconductor memory device in a fifth embodiment of the present invention.

Referring to FIG. 18, in comparison with the semiconductor memory device 900 shown in FIG. 1, a semiconductor memory device 930 additionally includes a detection signal external output circuit 80.

Since the other parts of a configuration of the block diagram is the same as those of the configuration of FIG. 1, no description thereof is repeated.

Figure 19:
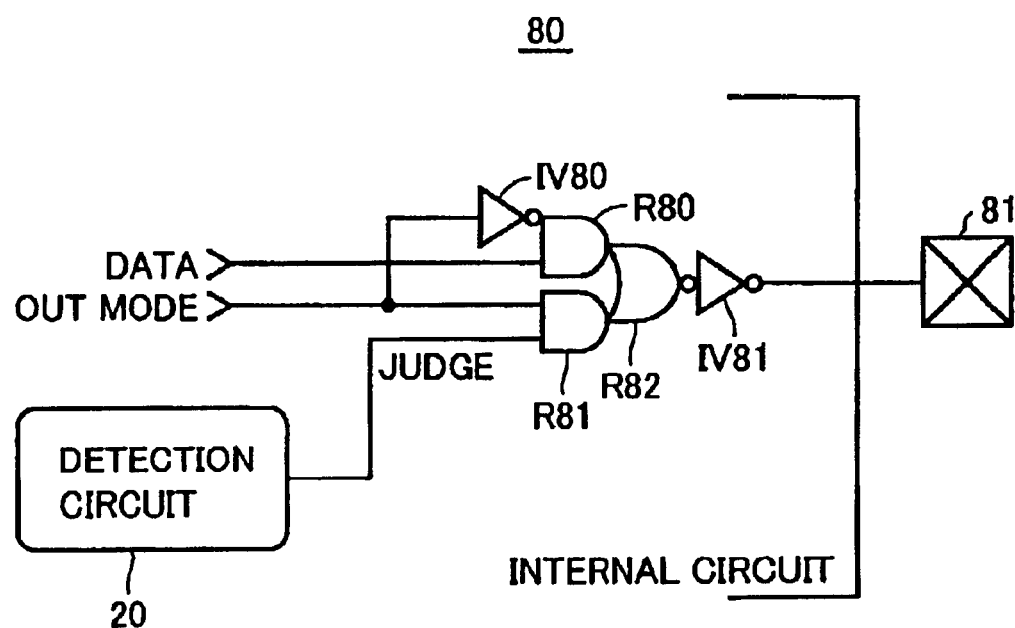
FIG. 19 is a diagram showing a configuration of a detection signal external output circuit for outputting a detection signal externally.

FIG. 19 is a diagram showing a configuration of a detection signal external output circuit for outputting a detection signal to the outside.

Referring to FIG. 19, detection signal external output circuit 80 includes inverters IV80 and IV81 logic gates R80 to R82 and an output pin 81.

Output pin 81 is also used as a data output pin. Logic gate R80 receives an output signal of inverter IV80 and a data signal to output a result of a NAND logical operation. Logic gate R81 receives detection signal JUDGE outputted from detection circuit 20 and an outmode signal OUTMODE to output a result of a NAND logical operation. Note that outmode signal OUTMODE is a signal produced in control circuit 40.

Logic gate R82 receives an output signal of logic gate R80 and an output signal of logic gate R81 to output a result of an NOR logical operation. Inverter IV81 receives an output of logic gate R82 to invert the output and to transmit the inverted output to output pin 81.

Description will be given of operation in detection signal external output circuit 80 having the above circuit configuration.

In a case where the semiconductor memory device is in an ordinary mode, outmode signal OUTMODE is L level. Therefore, logic gate R81 outputs a signal at H level at all times. As a result, a data signal is outputted from output pin 81.

On the other hand, in a case where detection signal JUDGE is outputted to the outside, outmode signal OUTMODE is H level. As a result, logic gate R80 outputs a signal at H level at all times. As a result, detection signal JUDGE is outputted from output pin 81.

With the above operation applied, detection signal JUDGE can be taken out to the outside.

Sixth Embodiment

Figure 20:
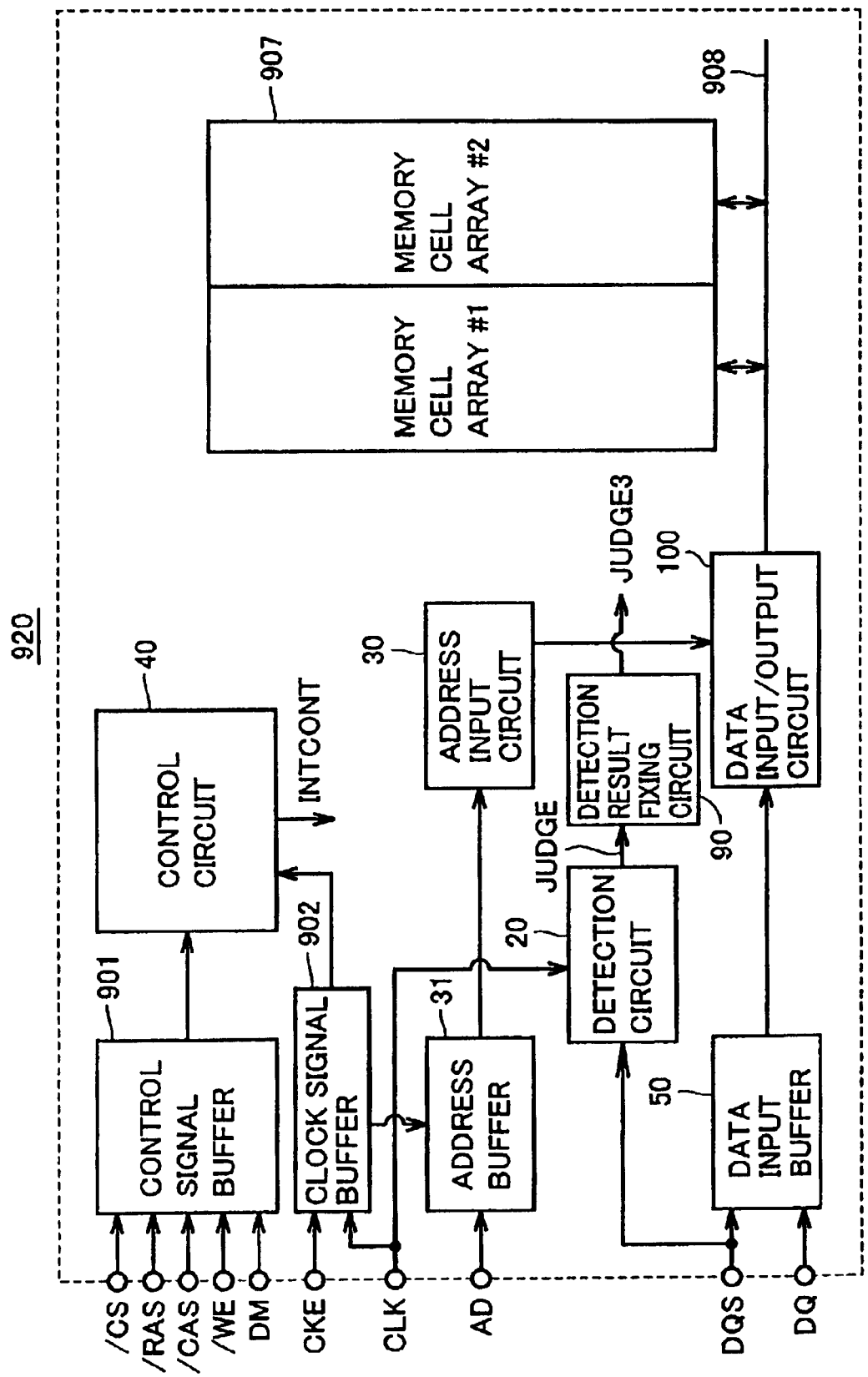
FIG. 20 is a block diagram showing a configuration of a semiconductor memory device in a sixth embodiment of the present invention.

FIG. 20 is a block diagram showing a configuration of a semiconductor memory device in a sixth embodiment of the present invention.

Referring to FIG. 20, in comparison with the semiconductor memory device 900 shown in FIG. 1, a semiconductor memory device 920 additionally includes a detection result fixing circuit 90.

Since the other parts of a configuration of the block diagram is the same as those of the configuration of FIG. 1, no description thereof is repeated.

Figure 21:
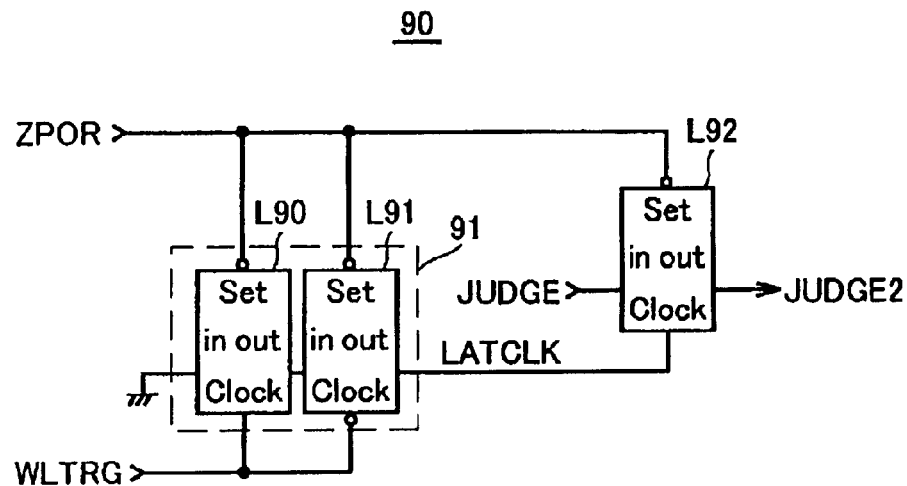
FIG. 21 is a circuit diagram showing a configuration of a detection result fixing circuit of FIG. 20.

FIG. 21 is a circuit diagram showing a configuration of detection result fixing circuit 90 of FIG. 20.

Referring to FIG. 21, detection result fixing circuit 90 includes a latch signal output circuit 91 and a latch circuit L92.

Latch signal output circuit 90 includes latch circuits L90 and L91.

Power-on reset signal ZPOR is inputted to both of the set terminals of latch circuits L90 to L92. The input terminal of latch circuit L90 is connected to ground node GND. Furthermore, the output terminal thereof is connected to the input terminal of latch circuit L91. The output terminal of latch circuit L91 is connected to the clock terminal of latch circuit L92. Signal WLTRG is inputted to the clock terminals of latch circuits L90 and L91. Signal WLTRG is a signal produced by control signal 40 when a write command is issued. Latch circuit L91 outputs latch signal LATCLK. Note that latch circuit L90 receives an input signal from the input terminal when signal WLTRG is at H level and latches an input signal when signal WLTRG is L level. Furthermore, latch circuit L91 receives an input signal from the input terminal when signal WLTRG is at L level and latches the input signal when signal WLTRG is at H level.

Latch circuit L92 receives detection signal JUDGE at the input terminal thereof and outputs the signal as detection signal JUDGE2. Latch circuit L92 receives detection signal JUDGE when latch signal LATCLK is at H level and latches detection signal JUDGE when latch signal LATCLK is L level.

Description will be given of operation in detection result fixing circuit 90 showing the above configuration.

Figure 22:
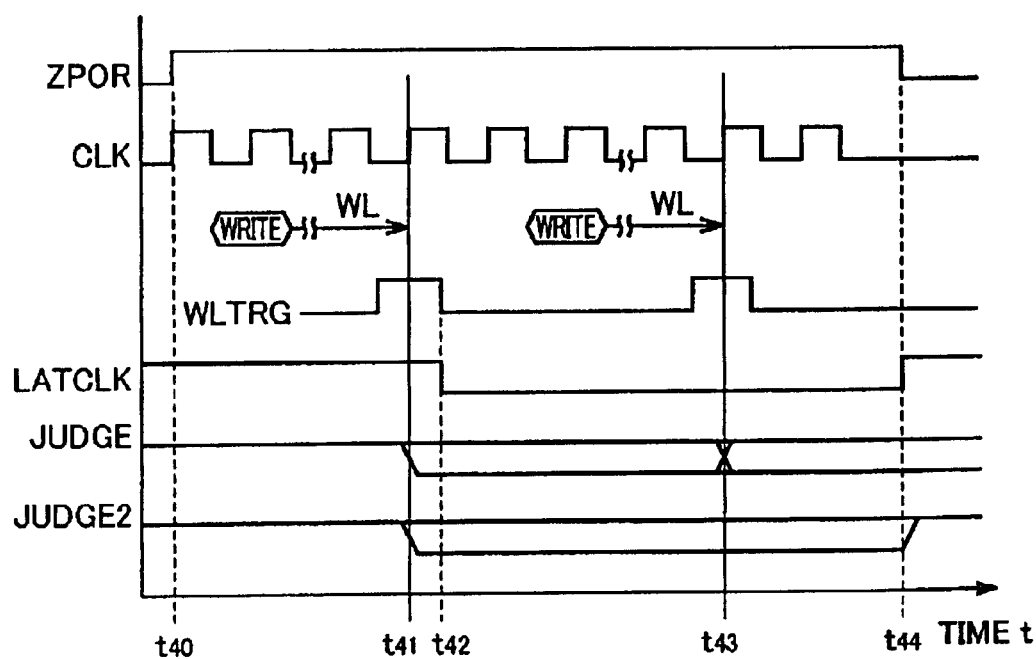
FIG. 22 is a timing chart showing operation in the detection result fixing circuit.

FIG. 22 is a timing chart showing operation in detection result fixing circuit 90.

Referring to FIG. 22, at a stage where power-on reset signal ZPOR before time t40 is at L level, output signals of latch circuits L90 to L92 are all at H level.

In succession, after signal WLTRG is activated, detection circuit 20 outputs detection signal JUDGE at time t41 when a write latency has passed. In succession, when signal WLTRG is driven to L level at time t42, latch signal LATCLK outputted from latch circuit L91 assumes L level. Therefore, latch circuit L92 latches detection signal JUDGE at time t42 to output the signal as a detection signal JUDGE2.

Note that when latch signal LATCLK is driven to L level, latch signal LATCLK is not activated to H level till power-on reset signal ZPOR is again driven to L level. Therefore, even if detection circuit 20 again outputs detection signal JUDGE at time t43, latch circuit L92 outputs detection signal JUDGE2 at a potential level latched at time t42.

When power-on reset signal ZPOR is driven to L level at time t44, output signals of latch circuits L90 to L92 are all reset to H level.

With the above operation applied, a detection result detected when a first write command is issued is held in a semiconductor memory device during a period when power is on. Therefore, the next write command operation and operations subsequent thereto can be corrected in the same timing based on the detection result.

Seventh Embodiment

Figure 23:
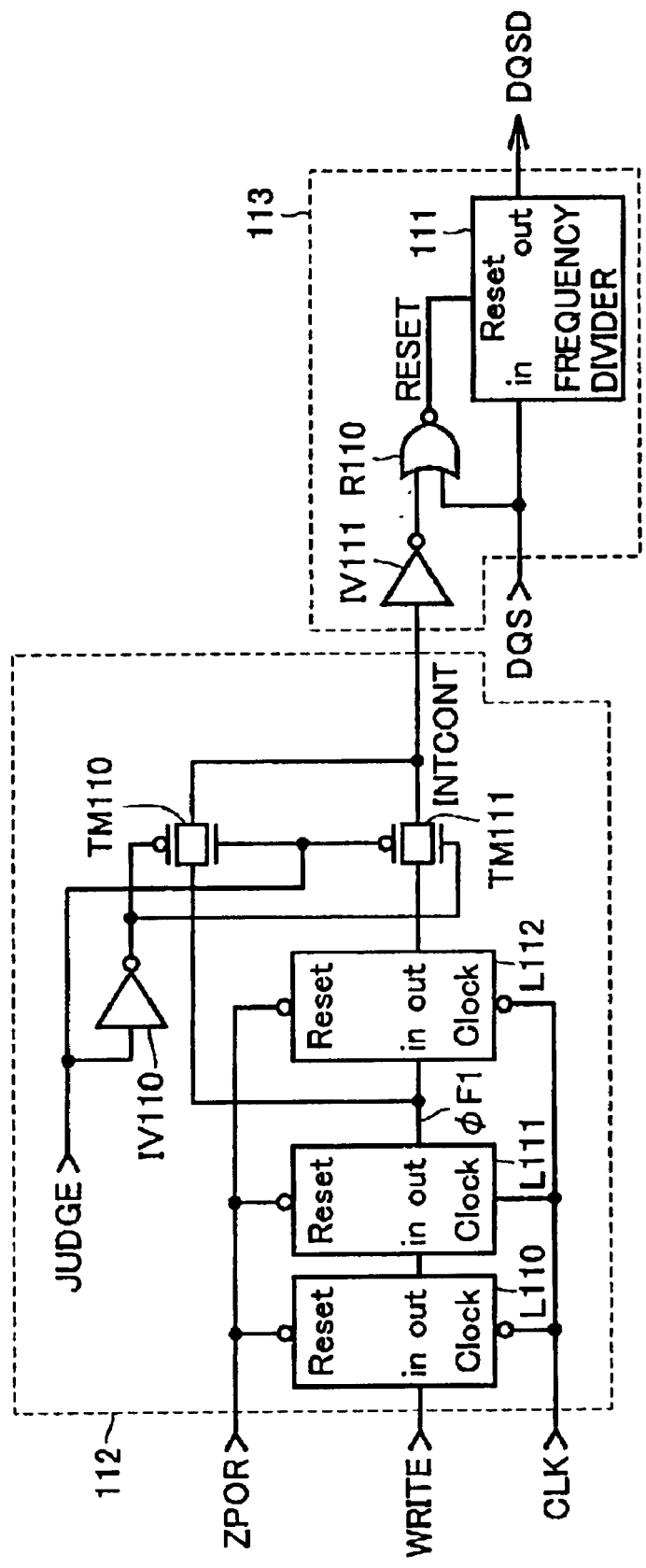
FIG. 23 is a block diagram showing a configuration of a control circuit and a frequency divider circuit, combined, in a seventh embodiment of the present invention.

FIG. 23 is a block diagram showing a configuration of a control circuit and a frequency divider combined in a seventh embodiment of the present invention.

Referring to FIG. 23, a control circuit 112 includes latch circuits L110 to L112; an inverter IV110 and transmission gates TM110 and TM111.

Latch circuits L110 to L112 are connected in series with each other. Power-on reset signal ZPOR is inputted to the reset terminals of latch circuits L110 to L112 and clock signal CLK is inputted to the clock terminals thereof Latch circuits L100 to L112 receive an input from the input terminals when clock signal CLK is at L level and latches an input signal when clock signal CLK is at H level. Note that latch circuit L100 receives write signal WRITE at the input terminal. Latch circuit L111 receives an output signal of latch circuit L110 when clock signal CLK is at H level and latches the output signal when clock signal CLK is L level to output the output signal as a signal φF1.

Transmission gate TM110 and TM111 are each constituted of a P channel MOS transistor and an N channel MOS transistor. The gate of the P channel MOS transistor of transmission gate TM110 receives an output signal of inverter IV110 and the gate of the N channel MOS transistor thereof receives detection signal JUDGE outputted from detection circuit 20. Note that inverter IV110 receives detection signal JUDGE to invert the signal and to output the inverted signal.

Transmission gate TM110 is turned on when detection signal JUDGE is at H level. As a result, control circuit 112 outputs signal φF1 as control signal INTCONT.

The gate of the P channel MOS transistor of transmission TM111 receives detection signal JUDGE and the gate of the N channel MOS transistor thereof receives an output signal of inverter IV110.

Transmission gate TM111 is turned on when detection signal JUDGE is at L level. As a result, control circuit 112 outputs an output signal of latch circuit L112 as control signal INTCONT.

A frequency divider circuit 113 is a circuit provided between an external input terminal to which data strobe signal DQS of the semiconductor memory device of FIG. 1 is inputted and data input/output circuit 100.

Frequency divider circuit 113 includes an inverter IV111 a logic gate R110 and a frequency divider 111.

Inverter IV111 receives control signal INTCONT outputted from control circuit 112 to invert the signal and to output the inverted signal. Logic gate R110 receives an output of inverter IV111 and data strobe signal DQS and outputs a result of a NOR logical operation as reset signal RESET.

Frequency divider 111 includes a one bit counter. Frequency divider 111 receives data strobe signal DQS at the input terminal. Furthermore, frequency divider 111 is reset by reset signal RESET. Frequency divider 111 outputs a frequency divided data strobe signal DQSD from the output terminal.

Description will be given of operation in a control circuit and a frequency divider circuit, combined, having the above circuit configuration.

Figure 24:
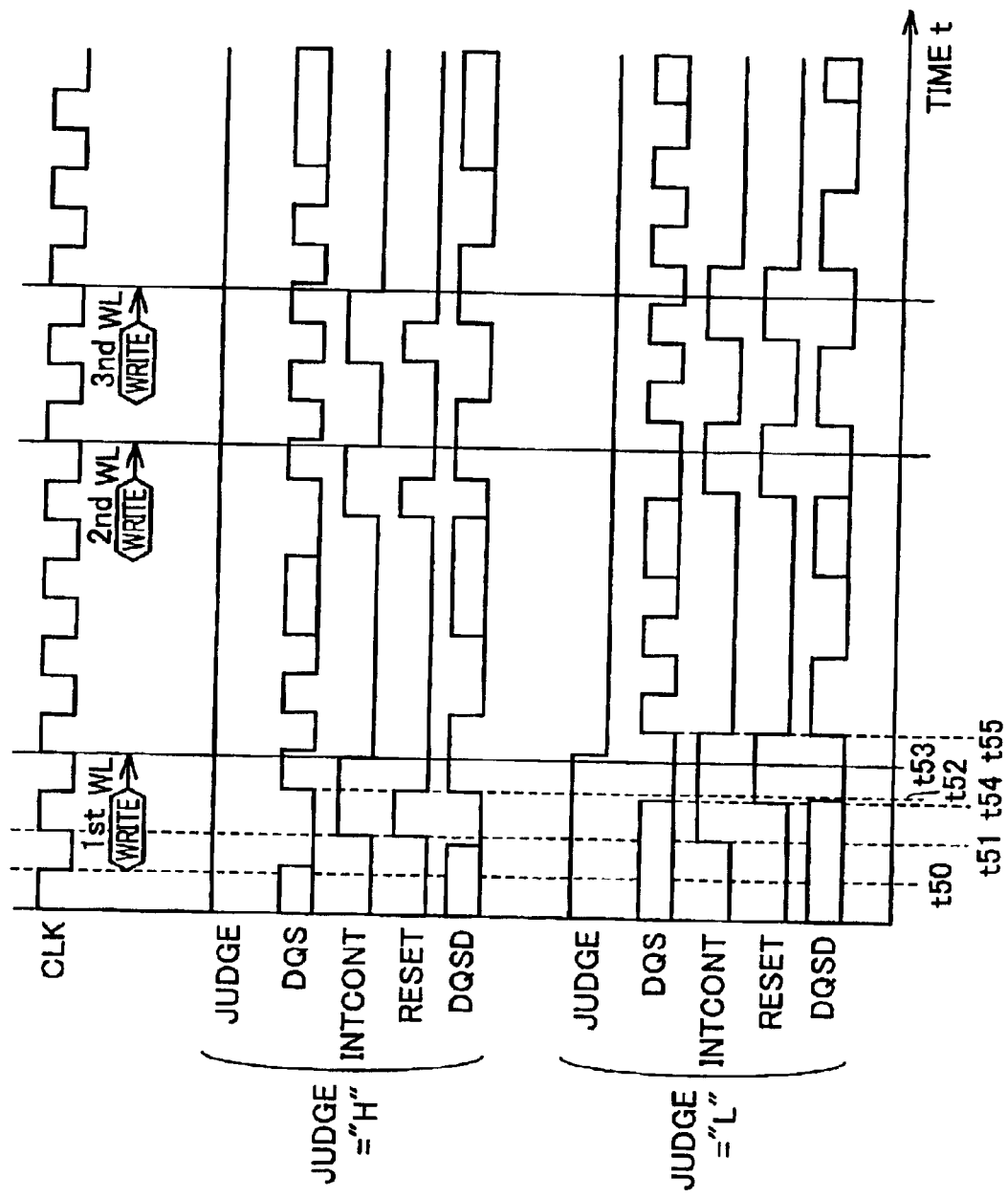
FIG. 24 is a timing chart showing operation in a control circuit and a frequency divider circuit, combined.
Figure 25:
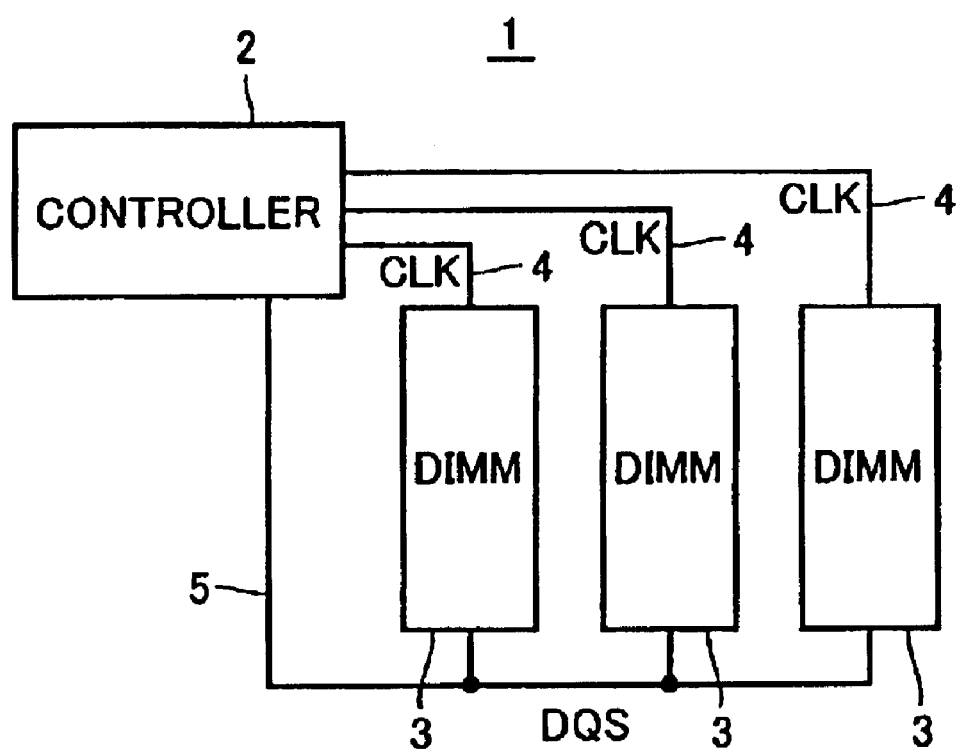
FIG. 25 is a block diagram showing a configuration of a data processing system using DDR SDRAM.

FIG. 24 is a timing chart showing operation in control circuit 112 and frequency divider circuit 113, combined.

Referring to FIG. 24, description will be first given of operation in control circuit 112 and frequency divider circuit 113, combined, in a case where detection signal JUDGE outputted from detection circuit 20 is at H level, that is where data strobe signal DQS is earlier than clock signal CLK.

Detection circuit 20 performs no detection till time t53 when a write latency passes. Detection signal JUDGE is maintained at H level in a period when detection circuit 20 performs no detection. Therefore, control signal INTCONT outputted from control circuit 112 assumes H level at time t51 when a half cycle of clock signal CLK passes from when write signal WRITE is H level at time t50.

At time t53, since detection signal JUDGE is at H level, transmission gate TM110 is turned on, while TM111 is turned off. As a result, signal φF1 outputted from latch circuit 111 is not inputted to latch circuit 112, but outputted as control signal INTCONT as it is. Therefore, control signal INTCONT is L level at time t53.

On the other hand, reset signal RESET outputted from logic gate R110 in frequency divider circuit 113 is driven to H level when data strobe signal DQS is at L level and control signal INTCONT is at H level.

Therefore, reset signal RESET rises at time t51 when control signal INTCONT rises and falls at time t52 when data strobe signal DQS rises.

As a result, divided data strobe signal DQSD rises at time t52 when reset signal RESET falls.

Therefore, a frequency divider is reset just before a first leading edge of data strobe signal DQS after write signal WRITE is activated. As a result, a relationship in phase between the first leading edge of data strobe signal DQS and frequency divided data strobe signal DQSD can be made the same at all times.

Then, description will be given of operation in control circuit 112 and frequency divider circuit 113, combined, in a case where detection signal is at L level, that is where data strobe signal DQS is later than clock signal CLK.

At time t51, control signal INTCONT rises. Here, at time t53, detection signal JUDGE is driven to L level. Therefore, in control circuit 112, transmission gate TM110 is turned off, while transmission gate TM111 is turned on. As a result, signal φF1 is inputted to latch circuit L112. Therefore, a pulse width of control signal INTCONT when detection signal JUDGE is at L level is larger than when detection signal JUDGE is at H level by a half cycle of clock signal CLK.

Accordingly, reset signal RESET outputted from logic gate R110 in frequency divider circuit 113 assumes H level at time t54 when data strobe signal DQS assumes L level in a period when control signal INTCONT is at H level.

Furthermore, reset signal RESET outputted from logic gate R110 in frequency divider circuit 113 assumes L level at time t55 when data strobe signal DQS assumes H level in a period when control signal INTCONT is at H level.

As a result, frequency divided data strobe signal DQSD outputted from frequency divider 111 assumes H level at time t55.

With the above operation applied, frequency divider is reset just before a first leading edge of data strobe signal DQS after write signal WRITE is activated. Therefore, a relationship in phase between the first leading edge of data strobe signal DQS and frequency divided data strobe signal DQSD can be kept the same at all times. As a result, a phase of frequency divided data strobe signal DQSD is shifted relative to data strobe signal DQS by a half cycle of frequency divided data strobe signal DQSD, thereby enabling circuit malfunction to be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a detection circuit for detecting a chase difference between a clock signal externally inputted and a strobe signal, externally inputted, for capturing data, and outputting a result of the detection as a detection signal; and
   a data input circuit for capturing said data in response to said detection signal,
   wherein said detection circuit includes a latch stage for latching said strobe signal in response to said clock signal.

2. The semiconductor memory device according to claim 1, further comprising: a delay circuit for delaying an input signal in response to said detection signal.

3. The semiconductor memory device according to claim 2, wherein said delay circuit includes a latch circuit for latching said input signal in response to said detection signal and said clock signal.

4. The semiconductor memory device according to claim 2, wherein said delay circuit includes a latch circuit for latching said input signal in response to said detection signal and said strobe signal.

5. The semiconductor memory device according to claim 1, wherein said data input circuit includes a latch circuit for latching said data inputted in response to said detection signal and said strobe signal.

6. The semiconductor memory device according to claim 1, further comprising: an external signal input circuit inputted with an external signal,
   wherein said external signal input circuit includes a latch circuit for latching said external signal in response to said detection signal and said clock signal.

7. The semiconductor memory device according to claim 1, further comprising: a control circuit for outputting a control signal and controlling all of said semiconductor memory device,
   wherein said control circuit includes a latch circuit for latching an input signal in response to said detection signal.

8. The semiconductor memory device according to claim 7, further comprising: an input buffer for operating during an activation period of said control signal.

9. The semiconductor memory device according to claim 7, further comprising: a frequency divider circuit for frequency dividing said strobe signal in response to said control signal.

10. The semiconductor memory device according to claim 1, wherein said detection circuit includes an output terminal for outputting said detection result externally.

11. The semiconductor memory device according to claim 1, further comprising: a detection result fixing circuit for latching said detection signal.

12. The semiconductor memory device according to claim 11, wherein said detection result fixing circuit includes a latch signal output circuit for outputting a latch signal in response to a write command, and a latch circuit for latching said detection signal in response to said latch signal, and being reset in response to a power-on reset signal.

* * * * *